US010062669B2

(12) United States Patent
Takayanagi

(10) Patent No.: US 10,062,669 B2
(45) Date of Patent: *Aug. 28, 2018

(54) SEMICONDUCTOR DEVICE

(71) Applicant: Renesas Electronics Corporation, Tokyo (JP)

(72) Inventor: Koji Takayanagi, Tokyo (JP)

(73) Assignee: Renesas Electronics Corporation, Koutou-ku, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/393,706

(22) Filed: Dec. 29, 2016

(65) Prior Publication Data
US 2017/0110442 A1 Apr. 20, 2017

Related U.S. Application Data

(63) Continuation of application No. 13/857,692, filed on Apr. 5, 2013, now Pat. No. 9,576,934.

(30) Foreign Application Priority Data

Apr. 27, 2012 (JP) .................................. 2012-103066

(51) Int. Cl.
H01L 25/065 (2006.01)
H01L 21/66 (2006.01)
(Continued)

(52) U.S. Cl.
CPC .......... H01L 25/0657 (2013.01); H01L 22/34 (2013.01); H01L 23/481 (2013.01);
(Continued)

(58) Field of Classification Search
None
See application file for complete search history.

(56) References Cited

U.S. PATENT DOCUMENTS

2009/0115026 A1  5/2009 Gerber et al.
2010/0259296 A1  10/2010 Or-Bach
(Continued)

FOREIGN PATENT DOCUMENTS

CN   203232867 U   10/2013
JP   2011-145257 A   7/2011

OTHER PUBLICATIONS

Communication dated Aug. 3, 2016, from the State Intellectual Property Office of People's Republic of China in counterpart Application No. 20130166873.5.
(Continued)

Primary Examiner — Vuthe Siek
Assistant Examiner — Aric Lin
(74) Attorney, Agent, or Firm — Sughrue Mion, PLLC

(57) ABSTRACT

A semiconductor device according to the present invention includes: a through via formed to penetrate a semiconductor substrate; first and second buffer circuits; a wiring forming layer formed in an upper layer of the semiconductor substrate; a connecting wiring portion formed in an upper portion of the through via assuming that a direction from the semiconductor substrate to the wiring forming layer is an upward direction, the connecting wiring portion being formed on a chip inner end face that faces the upper portion of the semiconductor substrate at an end face of the through via; a first path connecting the first buffer circuit and the through via; and a second path connecting the second buffer circuit and the through via. The first path and the second path are electrically connected through the connecting wiring portion.

14 Claims, 19 Drawing Sheets

(51) Int. Cl.
*H01L 23/48* (2006.01)
*H01L 23/528* (2006.01)
*H01L 25/18* (2006.01)
*H01L 23/31* (2006.01)
*H01L 23/00* (2006.01)

(52) U.S. Cl.
CPC ............ *H01L 23/528* (2013.01); *H01L 25/18* (2013.01); *H01L 23/3128* (2013.01); *H01L 24/05* (2013.01); *H01L 24/06* (2013.01); *H01L 24/16* (2013.01); *H01L 2224/0401* (2013.01); *H01L 2224/0557* (2013.01); *H01L 2224/06181* (2013.01); *H01L 2224/16145* (2013.01); *H01L 2224/16225* (2013.01); *H01L 2225/06513* (2013.01); *H01L 2225/06517* (2013.01); *H01L 2225/06544* (2013.01); *H01L 2225/06555* (2013.01); *H01L 2225/06582* (2013.01); *H01L 2225/06596* (2013.01); *H01L 2924/00014* (2013.01); *H01L 2924/1431* (2013.01); *H01L 2924/1436* (2013.01); *H01L 2924/15311* (2013.01)

(56) References Cited

U.S. PATENT DOCUMENTS

| | | | | |
|---|---|---|---|---|
| 2011/0175639 | A1* | 7/2011 | Yoko | G06F 1/12 324/762.06 |
| 2012/0242367 | A1* | 9/2012 | Goel | G01R 31/31855 326/16 |
| 2013/0230932 | A1* | 9/2013 | Bringivijayaraghavan | H01L 22/22 438/4 |
| 2013/0285055 | A1 | 10/2013 | Takayanagi | |

OTHER PUBLICATIONS

Communication dated Mar. 15, 2016, from the Japanese Patent Office in counterpart application No. 2012-103066.
Communication dated Jan. 3, 2017, from the State Intellectual Property Office of People's Republic of China in counterpart Application No. 201310166873.5.
Communication dated Feb. 24, 2017 from the State Intellectual Property Office of Taiwan in counterpart Application No. 102112233.

* cited by examiner

| THE NUMBER OF PMOS TRANSISTORS FOR DRIVING | THE NUMBER OF NMOS TRANSISTORS FOR DRIVING | VOLTAGE OF Vna, Vnb (IDEAL VALUE) |
|---|---|---|
| 1 | 1 | 1/2VDD |
| 1 | 2 | 1/3VDD |
| 1 | 3 | 1/4VDD |
| 2 | 1 | 2/3VDD |
| 3 | 1 | 3/4VDD |

Fig. 18

| THE NUMBER OF PMOS TRANSISTORS FOR DRIVING | THE NUMBER OF NMOS TRANSISTORS FOR DRIVING | VOLTAGE OF Vna, Vnb (IDEAL VALUE) | Vna, Vnb DURING DISCONNECTION (ON=PMOS) | Vna, Vnb DURING DISCONNECTION (ON=NMOS) |
|---|---|---|---|---|
| 1 | 1 | 1/2VDD | VDD | VSS |
| 1 | 2 | 1/3VDD | VDD | VSS |
| 1 | 3 | 1/4VDD | VDD | VSS |
| 2 | 1 | 2/3VDD | VDD | VSS |
| 3 | 1 | 3/4VDD | VDD | VSS |
| 1 | 0 | VDD | VDD | HiZ |
| 0 | 1 | VSS | HiZ | VSS |

Fig. 20

SEMICONDUCTOR DEVICE

CROSS-REFERENCE TO RELATED APPLICATIONS

This application is a continuation of U.S. application Ser. No. 13/857,692 filed Apr. 5, 2013 which is claiming priority from Japanese patent application No. 2012-103066, filed on Apr. 27, 2012, each of which, including the specification, drawings and abstract, is incorporated herein by reference in its entirety.

BACKGROUND

The present invention relates to a semiconductor device, and more particularly, to a semiconductor device having a through via formed therein to penetrate a semiconductor substrate.

In recent years, multi-chip package technology for encapsulating a plurality of semiconductor chips in a single semiconductor package has been developed to reduce a mounting area of a semiconductor device, for example. The encapsulation of a plurality of semiconductor chips in a single semiconductor package enables an increase in the number of lines between chips and an improvement in data transfer rate.

Japanese Unexamined Patent Application Publication No. 2011-145257 discloses an example of a semiconductor device utilizing the multi-chip package technology. In the technique disclosed in Japanese Unexamined Patent Application Publication No. 2011-145257, a semiconductor substrate has a through via (TSV: Through-Silicon Via) formed therein to penetrate the semiconductor substrate. In the semiconductor device disclosed in Japanese Unexamined Patent Application Publication No. 2011-145257, a plurality of semiconductor chips is stacked by utilizing the through via. Japanese Unexamined Patent Application Publication No. 2011-145257 discloses a technique for conducting a test to check whether there is a difference in the AC characteristic of the through via by using two semiconductor chips which are stacked vertically.

SUMMARY

However, the technique disclosed in Japanese Unexamined Patent Application Publication No. 2011-145257 requires a plurality of semiconductor chips to check the characteristics of each through via. This results in a problem that it is difficult to check a failure of each through via prior to stacking of semiconductor chips.

A first aspect the present invention is a semiconductor device including: a through via formed to penetrate a semiconductor substrate; a first buffer circuit and a second buffer circuit; a wiring forming layer formed in an upper layer of the semiconductor substrate; a connecting wiring portion formed in an upper portion of the through via assuming that a direction from the semiconductor substrate to the wiring forming layer is an upward direction, the connecting wiring portion being formed on a chip inner end face which is an end face of the through via, and facing the upper portion of the semiconductor substrate; a first path connecting the first buffer circuit and the through via; and a second path connecting the second buffer circuit and the through via. The first path and the second path are electrically connected via the connecting wiring portion.

The semiconductor device according to the first aspect of the present invention includes the connecting wiring portion formed in the upper portion of the chip inner end face of the through via. The first path and the second path are connected through the connecting wiring portion. Consequently, in the semiconductor device according to the present invention, when abnormality occurs in a connection state from a through via to a line within a chip due to expansion or contraction of the through via, the state of the connecting wiring portion can be checked using the first path and the second path and the connection state from the through via to the line within the chip can be checked. In other words, the semiconductor device according to the present invention is capable of checking the connection state from the through via to the line within the chip by using only the own chip.

The semiconductor device according to the present invention is capable of checking a connection state from a through via to a line within a chip by using only the own chip.

BRIEF DESCRIPTION OF THE DRAWINGS

The above and other aspects, advantages and features will be more apparent from the following description of certain embodiments taken in conjunction with the accompanying drawings, in which:

FIG. 18 is a table showing a relationship between the number of transistors in a conduction state and an ideal voltage in an IOLH test for the semiconductor device according to the ninth embodiment;

FIG. 20 is a table showing a relationship between the number of transistors in a conduction state and an ideal voltage in an IOLH test and a disconnection test of the semiconductor device according to the tenth embodiment;

DETAILED DESCRIPTION

First Embodiment

Figure 1:
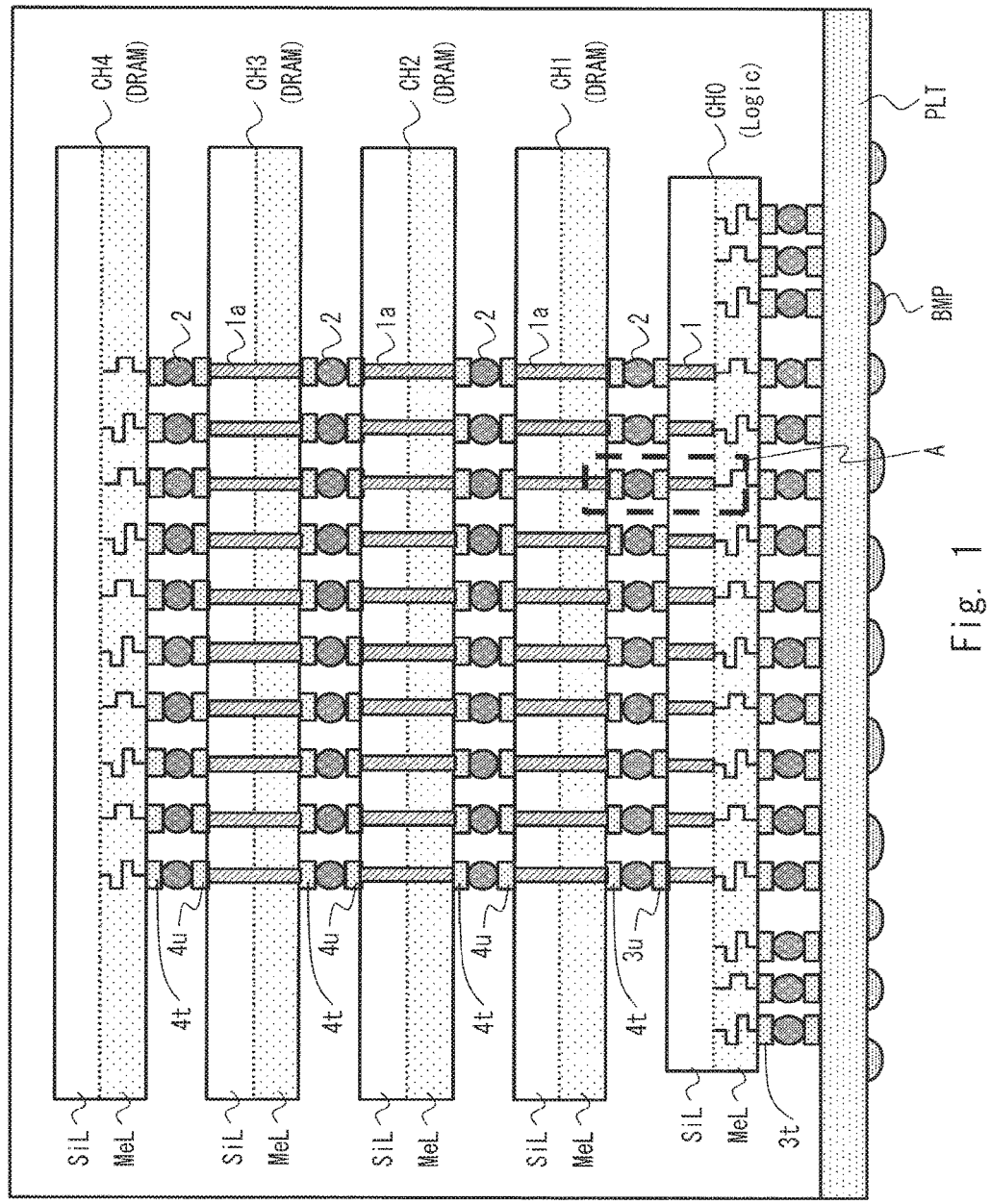
FIG. 1 is a sectional view of a semiconductor device according to a first embodiment.

Embodiments of the present invention will be described below with reference to the drawings. FIG. 1 shows a sectional view of a semiconductor device according to a first embodiment. As shown in FIG. 1, the semiconductor device according to the first embodiment has a configuration in which a plurality of semiconductor chips (for example, semiconductor chips CH0 to CH4) is encapsulated in a single package in a stacked state. In the example shown in FIG. 1, the semiconductor chips CH0 to CH4 are mounted in a face-down manner (for example, in a direction in which a circuit forming surface of a semiconductor substrate faces a package substrate PLT).

In the example shown in FIG. 1, the semiconductor device has a configuration in which the semiconductor chip CH0 is connected to the package substrate PLT through microbumps 2. Bumps BMP are provided on the back surface of the package substrate PLT, and these bumps allow the semiconductor device to be mounted on a substrate of equipment incorporating the semiconductor device. The semiconductor chip CH0 has through vias (TSV: Through-Silicon Via) 1 formed therein to penetrate the semiconductor substrate. The semiconductor chip CH0 communicates data with another semiconductor chip stacked thereon through the through vias 1.

The semiconductor chip CH0 includes a semiconductor substrate (for example, a silicon layer SiL), a wiring forming layer (for example, a metal layer MeL), and pads 3u and 3t. The silicon layer SiL is a semiconductor substrate layer in which circuit elements are formed. The metal layer MeL is a wiring forming layer in which a chip line that connects circuits and connects each circuit and an external terminal (for example, a pad 3t) is formed. Each pad 3t is an external terminal formed on the surface at the side of the metal layer MeL of the semiconductor chip. Each pad 3t is connected to a circuit formed on the circuit forming surface by a chip line formed in the metal layer MeL. Each pad 3u is an external terminal formed at an end face at the side of the silicon layer SiL of the semiconductor chip in the end face of each through via 1. The following description is made assuming that the direction from the silicon layer SiL to the metal layer MeL is an upward direction.

Each of the semiconductor chips CH1 to CH3 includes the silicon layer SiL, the metal layer MeL, through vias 1a, and pads 4t and 4u. The through vias 1a formed in each of the semiconductor chips CH1 to CH3 are formed to penetrate the silicon layer SiL and the metal layer MeL. These through vias 1a are connected to the chip line of each chip in an uppermost wiring layer of the metal layer MeL. The pads 4t are formed on the front surface side of the semiconductor chip (for example, the surface at the side of the metal layer MeL of the semiconductor chip). The pads 4u are formed on the back surface of the semiconductor chip (for example, the surface at the side of the semiconductor substrate layer of the semiconductor chip). Each of the semiconductor chips CH0 to CH3 is connected to a semiconductor chip having the pads 4t formed on an upper portion thereof, and is connected to a semiconductor chip having the pads 4u formed on a lower portion thereof. Each of the semiconductor chips CH1 to CH3 is connected to another chip through the microbumps 2.

The semiconductor chip CH4 includes the silicon layer SiL, the metal layer MeL, and the pads 4t. The semiconductor chip CH4 is a chip stacked as an uppermost layer and thus has no through via. The pads 4t of the semiconductor chip CH4 are connected to a circuit formed on the circuit forming surface by a chip line formed in the metal layer MeL. The semiconductor chip CH4 is connected to a semiconductor chip having the pads 4t formed on a lower portion thereof. The semiconductor chip CH4 is connected to another chip through the microbumps 2. FIG. 1 shows a configuration in which the semiconductor chip CH4 has no through via. However, it is also possible to employ a configuration in which the semiconductor chip CH4 has through vias as with the semiconductor chip CH0 or the semiconductor chips CH1 to CH3.

In the semiconductor device shown in FIG. 1, for example, an SoC (System On Chip) incorporating a number of logic circuits is used as the semiconductor chip CH0 disposed as a lowermost layer, and memory chips (for example, DRAMs (Dynamic Random Access Memories)) are used as the semiconductor chips CH1 to CH4 disposed as upper layers.

One feature of the semiconductor device according to the first embodiment resides in the method of configuring the chip line between each through via and the own chip. The feature enables checking of a connection state between each through via and chip line only by using the own chip. The structure of each through via and the chip line directly connected to the through via of the semiconductor device according to the first embodiment will be described in detail below. In particular, a through via peripheral region A shown in FIG. 1 will be described below.

Figure 2:
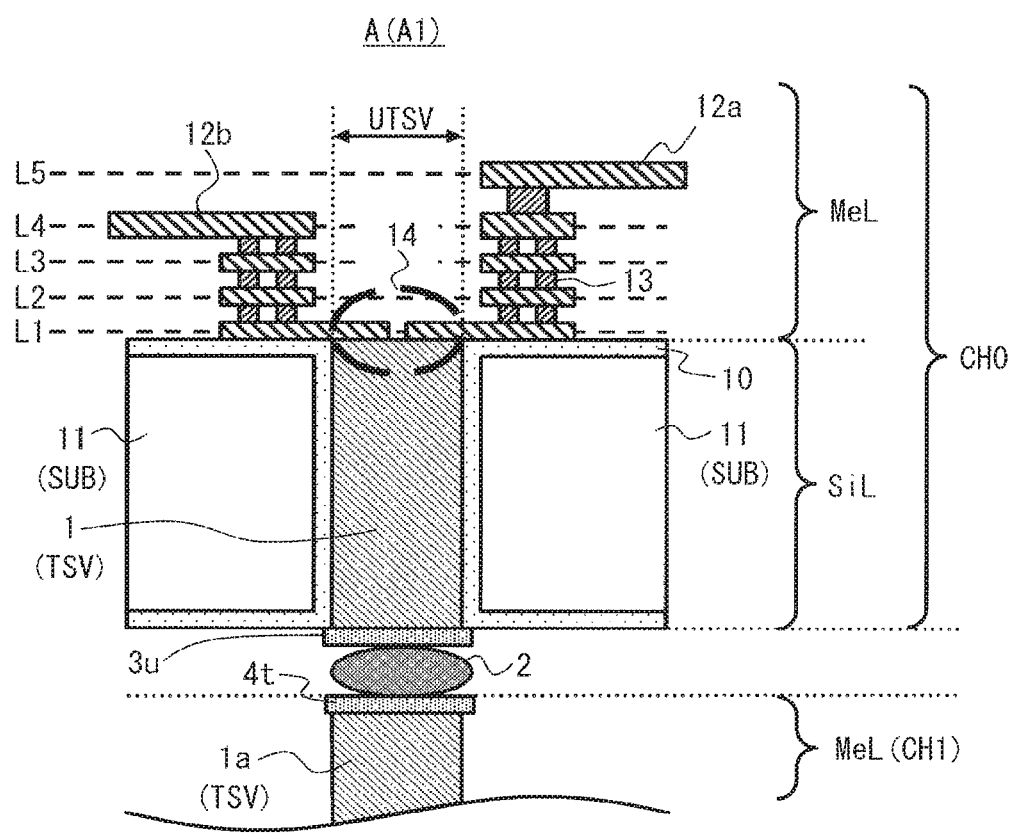
FIG. 2 is a sectional view illustrating a connecting area between a through via and a chip line of the semiconductor device according to the first embodiment.

FIG. 2 is a sectional view illustrating a connecting area (a through via connection region A1 of the first embodiment corresponding to the through via connection region A shown in FIG. 1) between a through via and a chip line of the semiconductor device according to the first embodiment. Though the sectional view shown in FIG. 2 illustrates the through via connection region A, the upper and lower relationship is reversed in FIGS. 1 and 2 for easy understanding of the explanation. Also in the following description, the sectional view in which the upper and lower relationship is reversed is used in each figure corresponding to the through via connection region A. In the following description, the terms "upper portion" and "lower portion" are used according to the upper and lower relationship illustrated in each sectional view. In other words, the following description is made assuming that the direction from the silicon layer SiL to the metal layer MeL is an upward direction. FIG. 2 illustrates the connection state of the through via 1 in the metal layer MeL of the semiconductor chip CH1 connected to the semiconductor chip CH0.

As shown in FIG. 2, the semiconductor device according to the first embodiment includes the through via 1, a connecting wiring portion 14, a first chip line 12a, and a second chip line 12b. The through via 1 is formed to penetrate a semiconductor substrate 11. In the example shown in FIG. 2, the through via 1 and the semiconductor substrate 11 are isolated by a barrier metal 10. In FIG. 2, the upper side corresponds to the circuit forming surface, and the lower side corresponds to the back surface side of the semiconductor chip. The pad 3u serving as a connection terminal with the semiconductor chip disposed above is formed at an end face of the back surface of the through via 1.

Assuming that the direction from the semiconductor substrate 11 to the metal layer MeL is an upward direction, the connecting wiring portion 14 is formed above the through via 1 and is provided at a chip inner end face which is an end face of the through via 1, and facing the upper side of the semiconductor substrate. From another point of view, the connecting wiring portion 14 includes a via connecting line which is connected to the through via and is formed on the circuit forming surface of the semiconductor substrate in a via connection region UTSV that is sandwiched between a first straight line along a first side wall of the through via 1 and a second straight line along a second side wall opposed to the first side wall in sectional view, assuming that a surface perpendicular to the circuit forming surface is a cross-section. In the example shown in FIG. 2, a part of one end of the first chip line 12a and a part of one end of the second chip line 12b are formed as the via connecting line.

One end of the first chip line 12a is connected to the connecting wiring portion 14. As described in detail below, the other end of the first chip line 12a is connected to a first buffer circuit. In the example shown in FIG. 2, the first chip line 12a is configured by lines formed in a first wiring layer L1 to a fifth wiring layer L5, and the lines formed in the different wiring layers are connected through a via 13. The first chip line 12a and the via 13 constitute a first path. A wiring path branching from the wiring path, which includes the first chip line 12a and the via 13, at the connecting wiring portion 14 is hereinafter referred to as "first path".

The second chip line 12b is connected to the first chip line 12a through the connecting wiring portion 14. As described in detail later, the other end of the second chip line 12b is connected to a second buffer circuit. In the example shown in FIG. 2, the second chip line 12b is configured by lines formed in the first wiring layer L1 to the fourth wiring layer L4, and the lines formed in different wiring layers are connected through the via 13. The second chip line 12b and the via 13 constitute a second path. A wiring path branching from the wiring path, which includes the second chip line 12b and the via 13, at the connecting wiring portion 14 is hereinafter referred to as "second path".

In the example shown in FIG. 2, the connecting wiring portion 14 corresponds to an end face at the side of the circuit forming surface of the through via 1 (this face is hereinafter referred to as "chip inner end face"). One end of the first chip line 12a is connected to the chip inner end face of the through via 1, and one end of the second chip line 12b is connected to the chip inner end face of the through via 1. Each of the first chip line 12a and the second chip line 12b includes a lowermost layer line (for example, a line formed in the first wiring layer L1) which is connected to the through via 1, and at least one upper layer line which is connected to the lowermost layer line through a via in a region other than the via connection region UTSV.

Specifically, the connecting wiring portion 14 is a portion that electrically connects the first path including the first chip line 12a with the second path including the second chip line 12b. In the semiconductor chip CH0, the connecting wiring portion 14 is an upper layer of the chip inner end face that faces the metal layer MeL of the through via 1, and is formed using the metal layer Mel that is in contact with the chip inner end face, the metal layer MeL that is not in contact with the chip inner end face, or the through via 1 itself. As shown in FIG. 2, in the semiconductor chip CH0 according to the first embodiment, the connecting wiring portion 14 is formed using the through via 1 itself.

Figure 3:
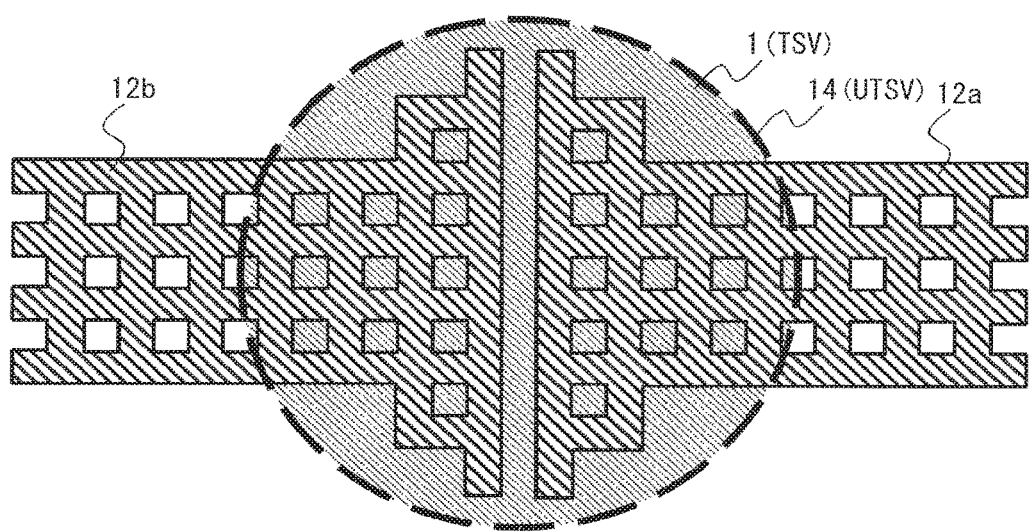
FIG. 3 is a schematic diagram of a planar layout illustrating a connecting area between a through via and a chip line of the semiconductor device according to the first embodiment.

The connecting wiring portion 14 will be described in more detail below. FIG. 3 is a schematic diagram of a planar layout (layout viewed from the circuit forming surface side of the semiconductor chip CH0) illustrating a connecting area between a through via and a chip line of the semiconductor device according to the first embodiment.

As shown in FIG. 3, the connecting wiring portion 14 is a wiring region formed with an area equal to or smaller than the area of the chip inner end face of the through via 1. In the example shown in FIG. 3, the connecting wiring portion 14 matches the via connection region UTSV. In the semiconductor device according to the first embodiment, the first chip line 12a and the second chip line 12b are formed so as to secure the electrical contact with the chip inner end face of the through via 1. The first chip line 12a and the second chip line 12b are formed so as to be separated from each other, and are electrically connected through the through via 1.

Figure 4:
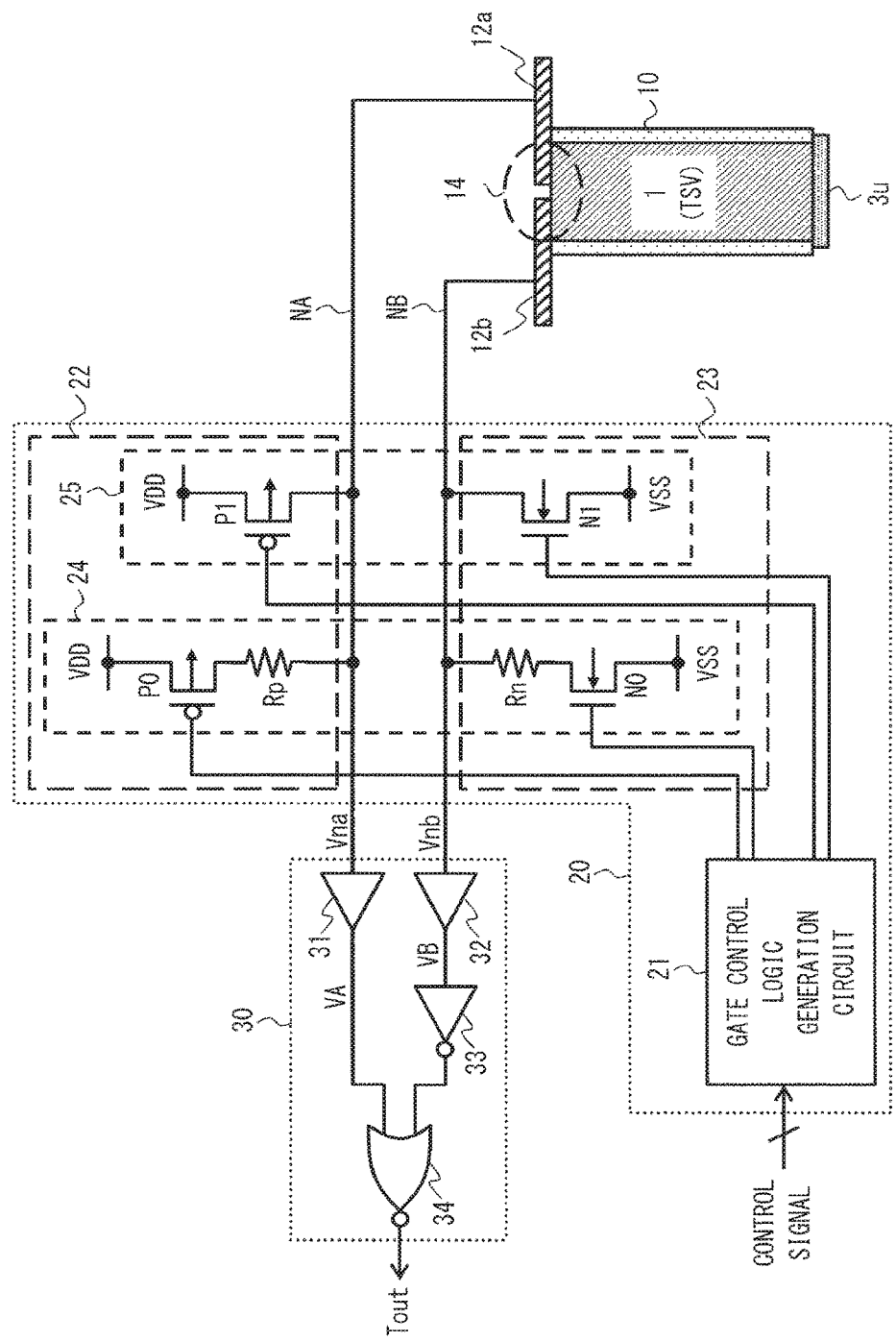
FIG. 4 is a circuit diagram showing circuits involving a test of the semiconductor device according to the first embodiment.

Next, a circuit for checking a connection state between through via 1 and the chip line in the semiconductor device according to the first embodiment will be described. FIG. 4 is a circuit diagram showing circuits involving a test of the semiconductor device according to the first embodiment.

As shown in FIG. 4, the circuit according to the first embodiment includes a buffer circuit 20 and a test circuit 30. The buffer circuit 20 includes a control circuit (for example, a gate control logic generation circuit 21), a first buffer circuit 22, and a second buffer circuit 23. The first buffer circuit 22 causes a current to flow to the second buffer circuit 23 through the connecting wiring portion 14.

More specifically, the first buffer circuit 22 includes PMOS transistors P0 and P1 and a first impedance element (for example, a resistor Rp). The source of the PMOS transistor P0 is connected to a first power supply (for example, a high-voltage-side power supply VDD). The drain of the PMOS transistor P0 is connected to a first path NA through the resistor Rp. The gate of the PMOS transistor P0 is supplied with a driving signal from the gate control logic generation circuit 21. The source of the PMOS transistor P1 is connected to the high-voltage-side power supply VDD. The drain of the PMOS transistor P1 is connected to the first path NA. The gate of the PMOS transistor P1 is supplied with the driving signal from the gate control logic generation circuit 21.

The second buffer circuit 23 includes NMOS transistors N0 and N1 and a second impedance element (for example, a resistor Rn). The source of the NMOS transistor N0 is connected to a second power supply (for example, a constant-voltage-side power supply VSS). The drain of the NMOS transistor N0 is connected to a second path NB through the resistor Rn. The gate of the NMOS transistor N0 is supplied with the driving signal from the gate control logic generation circuit 21. The source of the NMOS transistor N1 is connected to a low-voltage-side power supply VSS. The drain of the NMOS transistor N1 is connected to the second path NB. The gate of the NMOS transistor N1 is supplied with the driving signal from the gate control logic generation circuit 21.

The PMOS transistor P0, the resistor Rp, the NMOS transistor N0, and the resistor Rn constitute a test buffer circuit 24. In this embodiment, assume that the resistor Rp and the resistor Rp have the same resistance value. The PMOS transistor P1 and the NMOS transistor N1 constitute an output buffer circuit 25.

The gate control logic generation circuit 21 generates the driving signal based on a control signal which is externally supplied or supplied from another circuit (not shown), and controls the conduction state of each of the first buffer circuit 22 and the second buffer circuit 23 according to the driving signal.

More specifically, during a disconnection test, the gate control logic generation circuit 21 controls a first PMOS transistor (for example, the PMOS transistor P0) and a first NMOS transistor (for example, the NMOS transistor N0), which constitute the test buffer circuit 24, to be brought into the conduction state. In this configuration, if no disconnection occurs, a current flows from the PMOS transistor P0 to the NMOS transistor N0, and the same voltage (for example, ½ VDD) is generated at the first path NA and the second path NB. If a disconnection occurs, no current flows from the PMOS transistor P0 to the NMOS transistor N0. Further, a voltage Vna of the first path NA becomes a voltage VDD of the high-voltage-side power supply VDD, and a voltage Vnb of the second path NB becomes a voltage VSS of the low-voltage-side power supply VSS. During the disconnection test, the gate control logic generation circuit 21 brings the PMOS transistor P1 and the NMOS transistor N1 into a disconnected state.

During a normal operation, the gate control logic generation circuit 21 brings one of the PMOS transistor P1 and the NMOS transistor N1, which constitute the output buffer circuit 25, into the conduction state, thereby outputting a high-level signal (for example, the high-voltage-side power supply voltage VDD) or a low-level signal (for example, the low-voltage-side power supply voltage VSS) to the through via 1 as an output signal.

The test circuit 30 outputs a test result signal Tout indicating an occurrence of a disconnection in the connecting wiring portion 14, based on the fact that the voltage of the first path NA and the voltage of the second path NB have different voltage values.

The test circuit 30 includes comparators 31 and 32, an inverter 33, and an NOR circuit 34. The comparator 31 has a threshold voltage Vtha. When the voltage Vna of the first path NA is lower than the threshold voltage Vtha, the comparator 31 outputs a low-level signal, and when the voltage Vna is higher than the threshold voltage Vtha, the comparator 31 outputs a high-level signal. The comparator 32 has a threshold voltage Vthb. When the voltage Vnb of the second path NB is lower than the threshold voltage Vthb, the comparator 32 outputs a low-level signal, and when the voltage Vnb is higher than the threshold voltage Vthb, the comparator 32 outputs a high-level signal.

The inverter 33 outputs an inverted logic of the output signal of the comparator 32. The NOR circuit 34 outputs, as the test result signal Tout, a signal indicating an inverted logical OR of the output signal of the comparator 31 and the output signal of the inverter 33.

Figure 5:
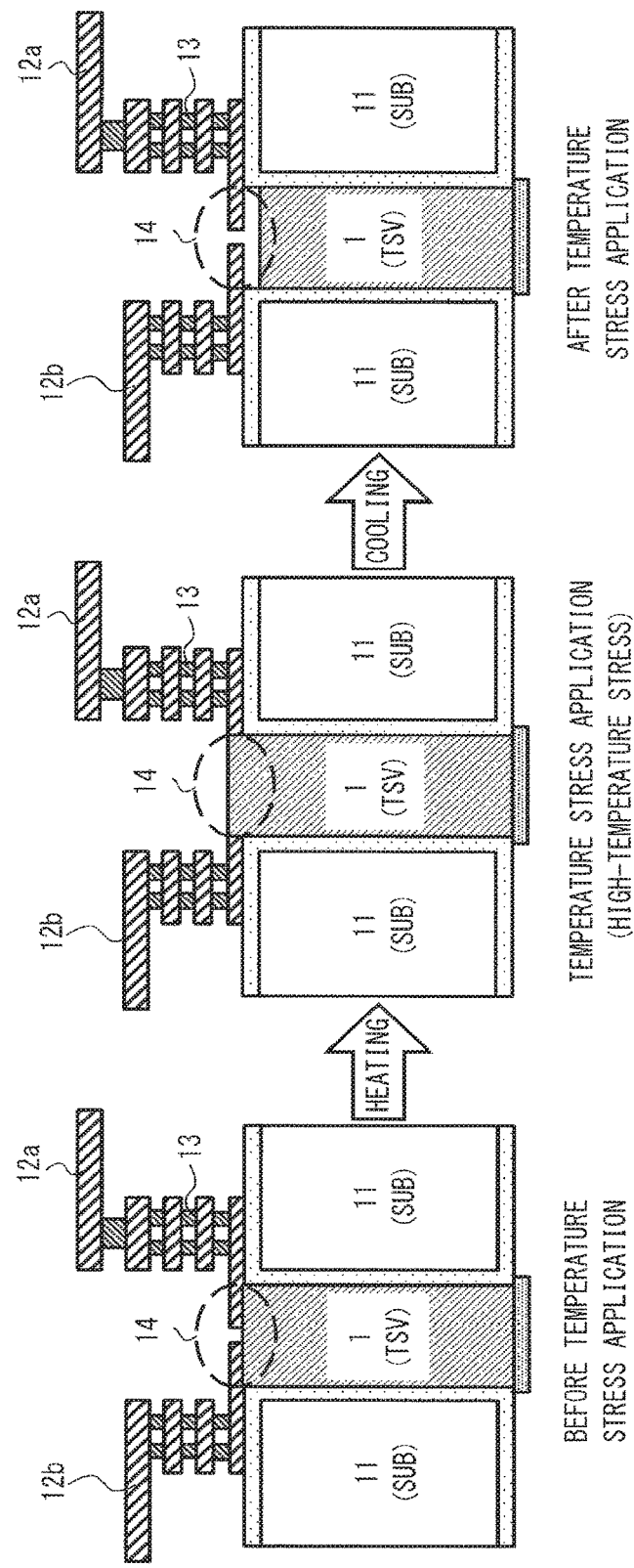
FIG. 5 is a sectional view illustrating expansion and contraction with respect to a temperature stress of a through via according to the first embodiment.

Subsequently, the disconnection test in the semiconductor device according to the first embodiment will be described in detail below. First, an example of a failure mode in which a disconnection occurs in the semiconductor device according to the first embodiment will be described. In the semiconductor device having the through vias 1, a disconnection may occur between a through via and a chip line due to the expansion and contraction caused by a temperature stress applied to each through via 1 during a manufacturing process. FIG. 5 shows a sectional view illustrating the expansion and contraction due to a temperature stress applied to a through via according to the first embodiment. As shown in FIG. 5, the manufacturing process for the semiconductor device includes a heating process and a cooling process. The through via 1 expands in the heating processing during the manufacturing process. The expansion causes the through via 1 to push up the chip line, so that a disconnection may occur in the chip line. After the heating process, a cooling process is carried out. When the through via 1 contracts due to the cooling process, the front-surface-side end face of the through via 1 recedes to a location lower than the surface on which the chip line is formed, which may cause a disconnection between the chip line and the through via 1.

In the semiconductor device according to the first embodiment, the disconnection can be checked in a test process using only the own chip. A disconnection test method for the semiconductor device according to the first embodiment will be described in detail below.

Figure 6:
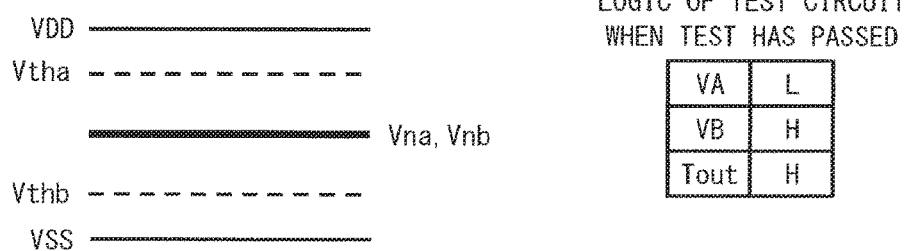
FIG. 6 is a diagram illustrating operation of a circuit when a disconnection test for a through via is conducted in the semiconductor device according to the first embodiment.

First, a description is given of a test result obtained in a normal state in which no disconnection involving a through via occurs in the semiconductor device according to the first embodiment. FIG. 6 is a diagram illustrating operation of the circuit when a disconnection test for a through via is conducted in the case where no disconnection occurs in the semiconductor device according to the first embodiment.

As shown in FIG. 6, when no disconnection occurs, the voltage Vna of the first path NA and the voltage Vnb of the second path NB are the same. The threshold voltages Vtha and Vthb of the comparators 31 and 32 according to the first embodiment are set so as to sandwich the voltages Vna and Vnb obtained when no disconnection occurs. Accordingly, in the state shown in FIG. 6, an output signal VA of the comparator 31 becomes low level and an output signal VB of the comparator 32 becomes high level. Thus, a high-level signal is output to the NOR circuit 34 based on the output signal VA and the inverted signal of the output signal VB.

Figure 7:
FIG. 7 is a diagram illustrating operation of a circuit when a disconnection test for a through via is conducted in the semiconductor device according to the first embodiment.

On the other hand, FIG. 7 shows a diagram illustrating operation of the circuit when a disconnection test for a through via is conducted in the case where a disconnection occurs in the semiconductor device according to the first embodiment. As shown in FIG. 7, when a disconnection occurs, the voltage Vna of the first path NA becomes the voltage VDD of the high-voltage-side power supply, and the voltage Vnb of the second path NB becomes the voltage VSS of the low-voltage-side power supply. Accordingly, in the state shown in FIG. 7, the output signal VA of the comparator 31 becomes high level and the output signal VB of the comparator 32 becomes low level. Thus, a low-level signal is output to the NOR circuit 34 based on the output signal VA and the inverted signal of the output signal VB.

In the semiconductor device according to the first embodiment, when a disconnection occurs in the connecting wiring portion 14, particularly, in the portion between the through via 1 and the chip line, the value of the test result signal Tout varies. This enables checking of the presence or absence of a disconnection by monitoring the test result signal from the outside.

As described above, assuming that the direction from the semiconductor substrate 11 to the metal layer MeL is an upward direction, the semiconductor device according to the first embodiment includes the connecting wiring portion 14 which is formed at an upper portion of the through via 1 and is provided at a chip inner end face which is an end face of the through via 1, and facing the upper side of the semiconductor substrate 11; the first path NA that connects the first buffer circuit and the through via 1; and the second path NB that connects the second buffer circuit and the through via. In the semiconductor device according to the first embodiment, the first path NA and the second path NB are electrically connected through the connecting wiring portion 14.

With this configuration, the semiconductor device according to the first embodiment is capable of detecting a disconnection of the chip line due to the through via 1 and a disconnection between the through via 1 and the chip line by using only the own chip.

Wide-IO standard is one of the standards that utilize the through vias 1. In this Wide-IO standard, the through vias 1 are arranged at a pitch of 40 μm and each of pads respectively connected to the through vias 1 has a diameter of about 20 μm. In the Wide-IO standard, several hundred through vias 1 are formed per chip. Accordingly, a semiconductor chip having a number of through vias compliant to the Wide-IO standard or the like has a problem in that the characteristics of each through vias 1 cannot be actually checked by a probe test. However, as in the technique disclosed in Japanese Unexamined Patent Application Publication No. 2011-145257, when the characteristics of each through vias 1 are checked in the state where semiconductor chips are stacked, there is a problem that the manufacturing yield of the semiconductor device deteriorates.

However, the semiconductor device according to the first embodiment is capable of checking the characteristics of each through via 1 at a stage prior to the stage of stacking the semiconductor chips, which leads to an improvement in the manufacturing yield of the semiconductor device. In addition, in a multi-chip package, one semiconductor device may be manufactured by combining a semiconductor chip manufactured by its own company with a semiconductor chip purchased from another company. In such a case, however, the use of the semiconductor chip according to the first embodiment prevents defective chips in which a disconnection occurs in the through via 1 from being distributed to another company. This improves the reliability of each semiconductor chip manufactured by the own company.

Second Embodiment

Figure 8:
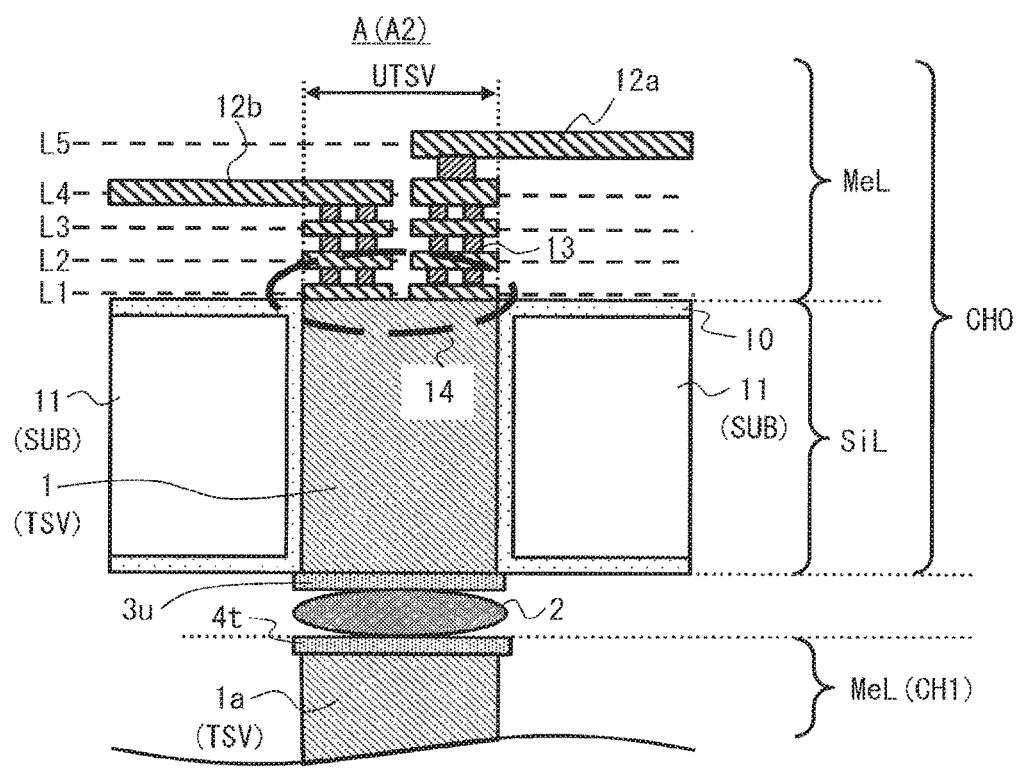
FIG. 8 is a sectional view illustrating a connecting area between a through via and a chip line of a semiconductor device according to a second embodiment.

In a second embodiment, another mode of each of the first chip line 12a and the second chip line 12b will be described. FIG. 8 shows a sectional view illustrating a connecting area (a through via connection region A2 of the second embodiment corresponding to the through via connection region A shown in FIG. 1) between a through via and a chip line of the semiconductor device according to the second embodiment.

As shown in FIG. 8, in the semiconductor device according to the second embodiment, each of the first chip line 12a and the second chip line 12b includes a via connecting line connected to the through via 1, and at least one upper layer line connected to the via connecting line through the via in the via connection region UTSV.

Thus, even when a plurality of lines is stacked through the via in the via connection region UTSV, if the through via 1 expands, a breakage occurs in the line and the via, with the result that a disconnection occurs between the first chip line 12a and the second chip line 12b. Also when the through via 1 contracts and the first chip line 12a and the second chip line 12b are separated from each other, a disconnection occurs between the through via 1 and the chip line. Accordingly, the disconnection can be checked using the buffer circuit 20 and the test circuit 30 according to the first embodiment.

Third Embodiment

Figure 9:
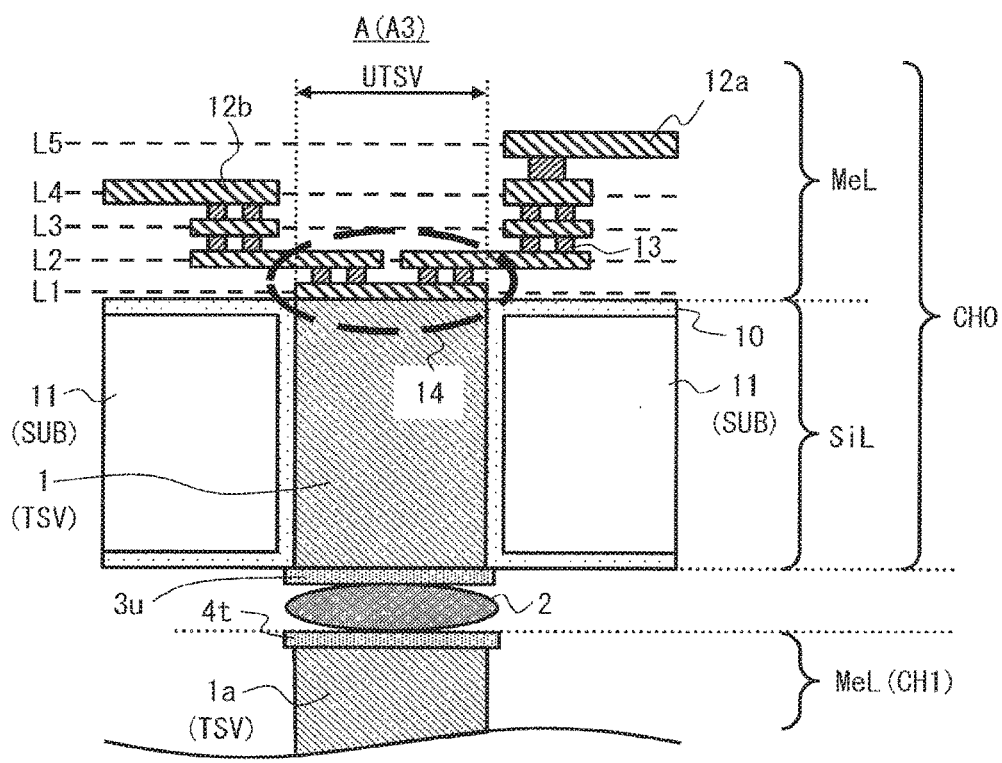
FIG. 9 is a sectional view illustrating a connecting area between a through via and a chip line of a semiconductor device according to a third embodiment.

In a third embodiment, another mode of the configuration of the connecting wiring portion 14 will be described. FIG. 9 shows a sectional view illustrating a connecting area (a through via connection region A3 of the third embodiment corresponding to the through via connection region A shown in FIG. 1) between a through via and a chip line of the semiconductor device according to the third embodiment.

As shown in FIG. 9, in the semiconductor device according to the third embodiment, the connecting wiring portion 14 includes a lowermost layer line formed in an upper layer of the end face at the side of the circuit forming surface of the through via 1. Each of the first chip line 12a and the second chip line 12b includes at least one upper layer line connected to the lowermost layer line through the via in a region other than the via connection region UTSV.

Figure 10:
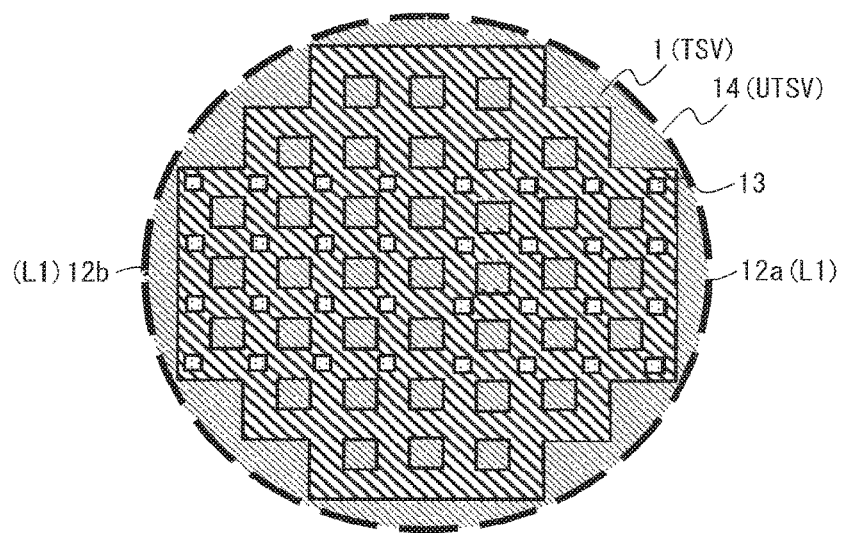
FIG. 10 is a schematic view of a planar layout illustrating a connecting area between a through via and a chip line of the semiconductor device according to the third embodiment.

The connecting wiring portion 14 according to the third embodiment will be described in more detail below. FIG. 10 is a schematic diagram of a planar layout illustrating a connecting area between a through via and a chip line of the semiconductor device according to the third embodiment. The planar layout shown in FIG. 10 illustrates the lowermost layer line constituting the connecting wiring portion 14, and the via formed on the lowermost layer line.

As shown in FIG. 10, the connecting wiring portion 14 is defined so as to fit the outer peripheral shape of the through via 1. That is, the connecting wiring portion 14 directly fits the via connection region UTSV. In the semiconductor device according to the third embodiment, a lowermost layer line 12 (L1) is formed to be contained in the via connection region UTSV. This lowermost layer line 12 (L1) is formed to secure an electrical contact with the through via 1.

Figure 11:
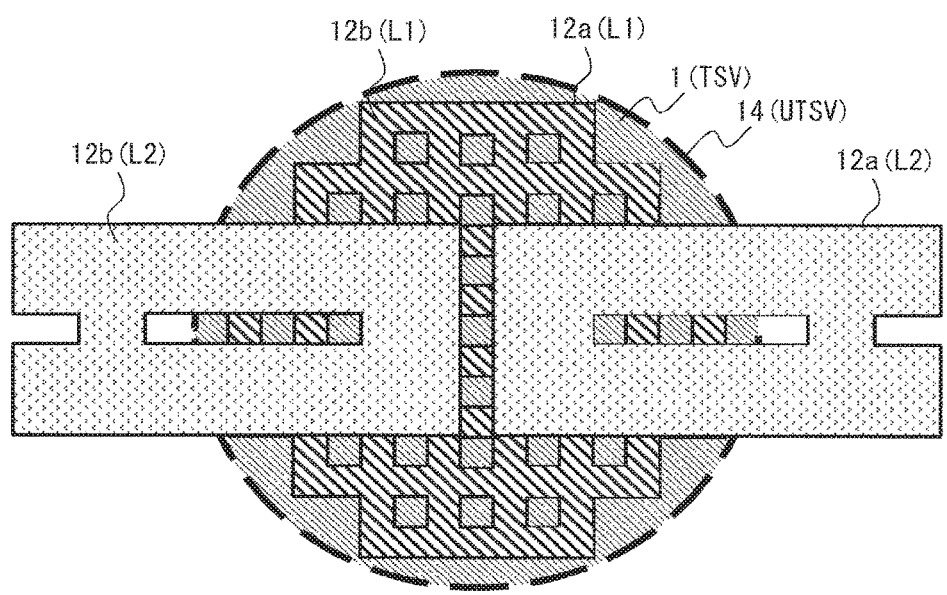
FIG. 11 is a schematic view of a planar layout illustrating first and second chip lines connected to a connecting wiring portion according to the third embodiment.

FIG. 11 shows a schematic diagram of a planar layout illustrating first and second chip lines connected to the connecting wiring portion 14 of the semiconductor device according to the third embodiment. As shown in FIG. 11, in the semiconductor device according to the third embodiment, the lines formed in the second wiring layer L2 are formed to be separated from each other. One of the lines formed to be separated from each other serves as the first chip line 12a, and the other line serves as the second chip line 12b. The first chip line 12a and the second chip line 12b are connected to the lowermost layer line through the via shown in FIG. 10.

Thus, in the third embodiment, the lines which are formed of the lowermost layer line formed by continuously forming the via connecting line of the connecting wiring portion 14 and which are stacked through the via in the via connection region UTSV are defined as the first chip line 12a and the second chip line 12b. Even when the connecting wiring portion 14 is formed in this manner, if the through via 1 expands, a breakage occurs in the line and the via, with the result that a disconnection occurs between the first chip line 12a and the second chip line 12b. Also when the through via 1 contracts and the first chip line 12a and the second chip line 12b are separated from each other, a disconnection occurs between the through via 1 and the chip line. Accordingly, the disconnection can be checked using the buffer circuit 20 and the test circuit 30 according to the first embodiment.

Fourth Embodiment

Figure 12:
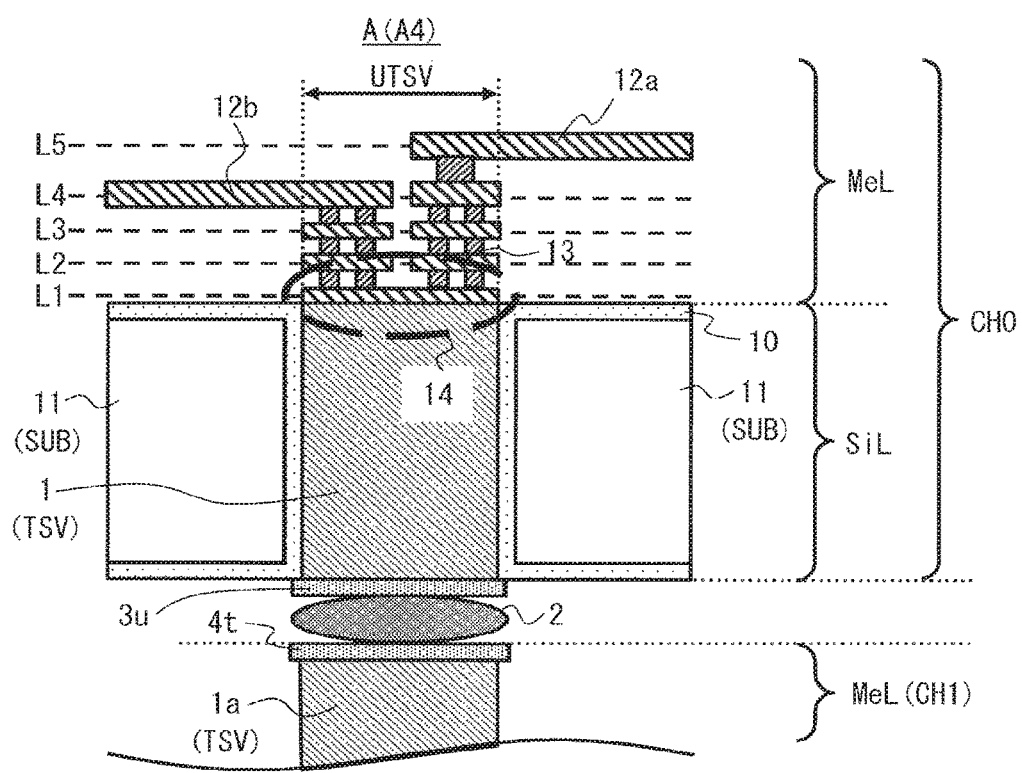
FIG. 12 is a sectional view illustrating a connecting area between a through via and a chip line of a semiconductor device according to a fourth embodiment.

In a fourth embodiment, another mode of each of the first chip line 12a and the second chip line 12b of the semiconductor device according to the third embodiment will be described. FIG. 12 shows a sectional view illustrating a connecting area (a through via connection region A4 of the fourth embodiment corresponding to the through via connection region A shown in FIG. 1) between a through via and a chip line of the semiconductor device according to the fourth embodiment.

As shown in FIG. 12, in the semiconductor device according to the fourth embodiment, the connecting wiring portion 14 includes a via connecting line formed in an upper layer of the end face at the side of the circuit forming surface of the through via 1. Each of the first chip line 12a and the second chip line 12b includes at least one upper layer line connected to the via connecting line through the via in the via connection region UTSV.

Thus, even when a plurality of lines is stacked through a via in the via connection region UTSV, if the through via 1 expands, a breakage occurs in the line and the via, with the result that a disconnection occurs between the first chip line 12a and the second chip line 12b. If the through via 1 contracts, the via connecting line is disconnected, so that the portion that electrically connects the first chip line 12a and the second chip line 12b is eliminated. As a result, a disconnection occurs between the first chip line 12a and the second chip line 12b. Accordingly, the disconnection can be checked using the buffer circuit 20 and the test circuit 30 according to the first embodiment.

Fifth Embodiment

Figure 13:
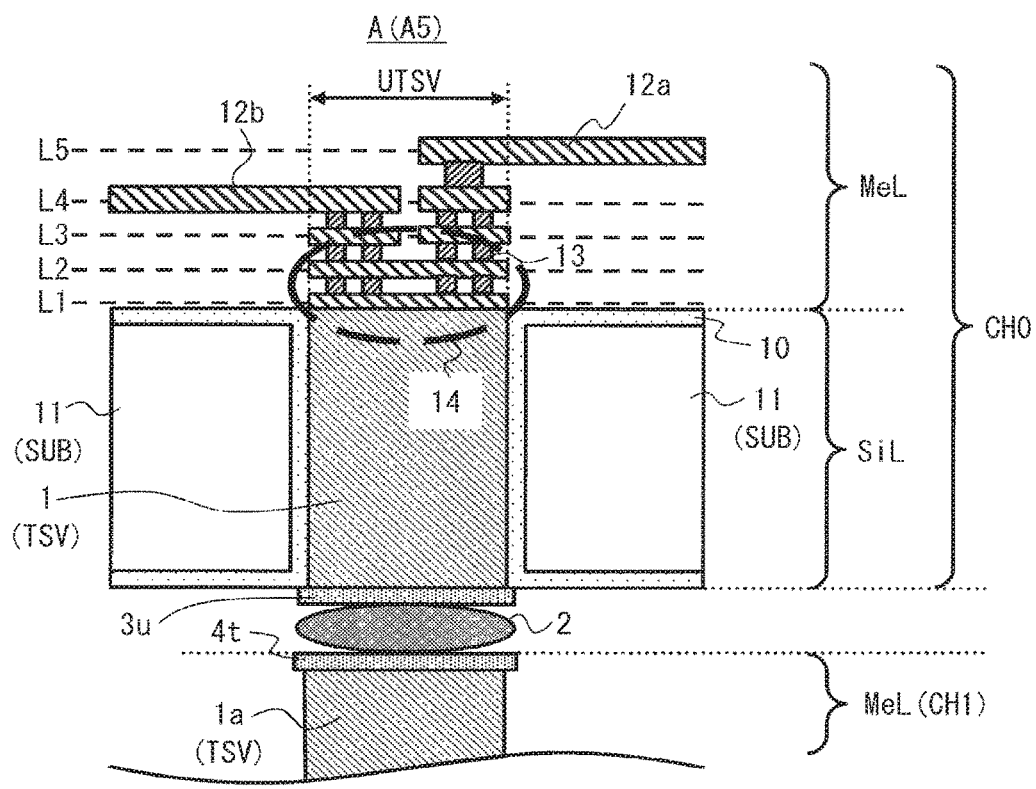
FIG. 13 is a sectional view illustrating a connecting area between a through via and a chip line of a semiconductor device according to a fifth embodiment.

In a fifth embodiment, another mode of each of the first chip line 12a and the second chip line 12b of the semiconductor device according to the third embodiment will be described. FIG. 13 shows a sectional view illustrating a connecting area (a through via connection region A5 of the fifth embodiment corresponding to the through via connection region A shown in FIG. 1) between a through via and a chip line of the semiconductor device according to the fifth embodiment.

As shown in FIG. 13, in the semiconductor device according to the fifth embodiment, the connecting wiring portion 14 includes a via connecting line formed in an upper layer of the end face at the side of the circuit forming surface of the through via 1; and at least one first upper layer line connected to the via connecting line through the via. Each of the first chip line 12a and the second chip line 12b includes a second upper layer line connected to the first upper layer line through the via.

Thus, even when a plurality of lines is stacked through the via in the via connection region UTSV, if the through via 1 expands, a breakage occurs in the line and the via, with the result that a disconnection occurs between the first chip line 12a and the second chip line 12b. If the through via 1 contracts, the via connecting line is disconnected, so that the portion that electrically connects the first chip line 12a and the second chip line 12b is eliminated. As a result, a disconnection occurs between the first chip line 12a and the second chip line 12b. Accordingly, the disconnection can be checked using the buffer circuit 20 and the test circuit 30 according to the first embodiment. Thus, when the connecting wiring portion 14 is formed of a plurality of lines formed in a plurality of wiring layers, a disconnection between the through via 1 and the chip line is prevented from occurring due to a certain amount of expansion and contraction of the through via 1, for example.

Sixth Embodiment

Figure 14:
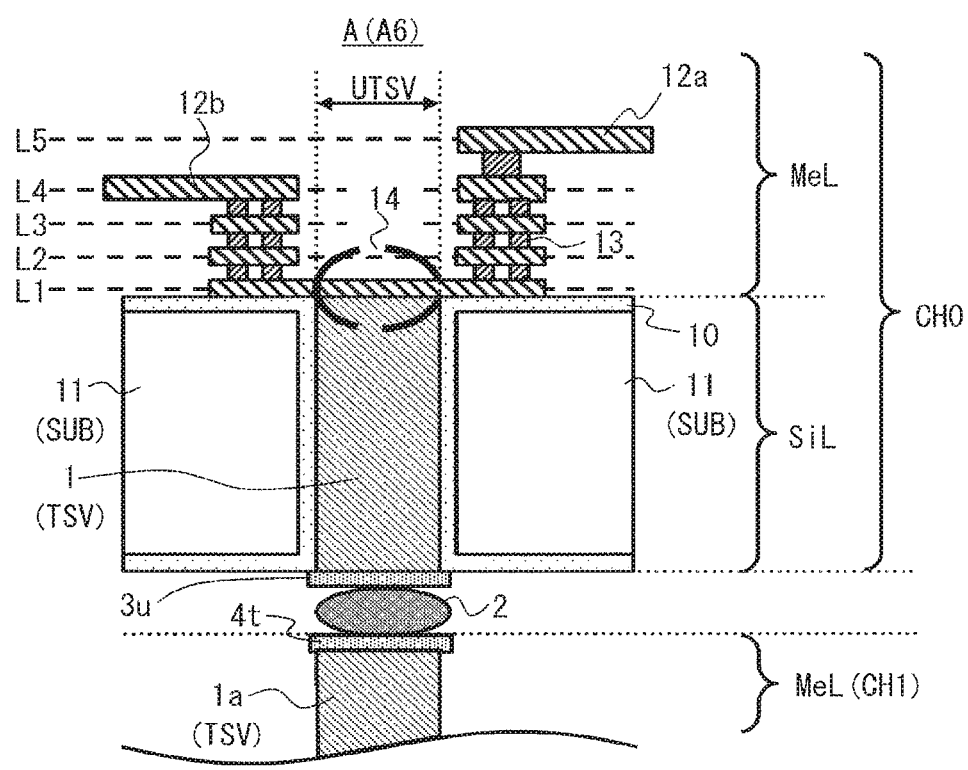
FIG. 14 is a sectional view illustrating a connecting area between a through via and a chip line of a semiconductor device according to a sixth embodiment.

In a sixth embodiment, another mode of each of the first chip line 12a and the second chip line 12b of the semiconductor device according to the third embodiment will be described. FIG. 14 shows a sectional view illustrating a connecting area (a through via connection region A6 of the sixth embodiment corresponding to the through via connection region A shown in FIG. 1) between a through via and a chip line of the semiconductor device according to the sixth embodiment.

As shown in FIG. 14, in the semiconductor device according to the sixth embodiment, the connecting wiring portion 14 includes a via connecting line formed in an upper layer of the end face at the side of the circuit forming surface of the through via 1. Each of the first chip line 12a and the second chip line 12b includes at least one upper layer line connected to the via connecting line through the via in a region other than the via connection region UTSV.

Thus, even when a plurality of lines is stacked through the via in a region other than the via connection region UTSV, if the through via 1 expands, a breakage occurs between the via connecting line and the line formed in the same wiring layer as the via connecting line, so that a disconnection occurs between the first chip line 12a and the second chip line 12b. If the through via 1 contracts, the via connecting line is separated from the first chip line 12a and the second chip line 12b, with the result that a disconnection occurs between the first chip line 12a and the second chip line 12b. Accordingly, the disconnection can be checked using the buffer circuit 20 and the test circuit 30 according to the first embodiment.

Seventh Embodiment

Figure 15:
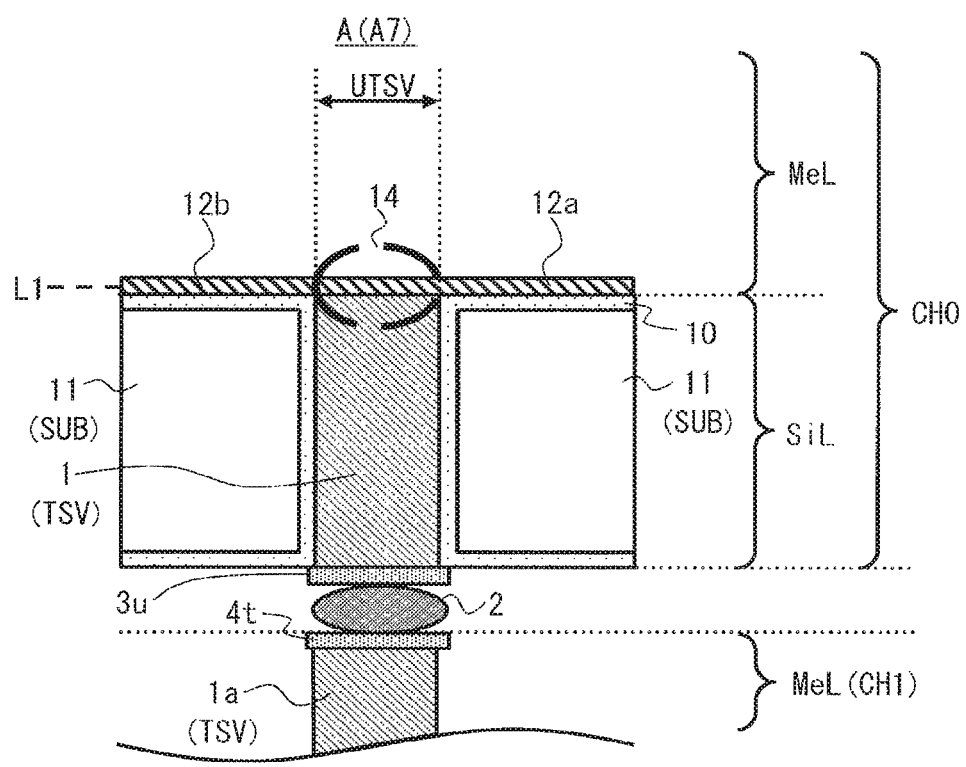
FIG. 15 is a sectional view illustrating a connecting area between a through via and a chip line of a semiconductor device according to a seventh embodiment.

In a seventh embodiment, another mode of the first chip line 12a and the second chip line 12b of the semiconductor device according to the third embodiment will be described. FIG. 15 shows a sectional view illustrating a connecting area (a through via connection region A7 of the seventh embodiment corresponding to the through via connection region A shown in FIG. 1) between a through via and a chip line of the semiconductor according to the seventh embodiment.

As shown in FIG. 15, in the semiconductor device according to the seventh embodiment, the connecting wiring portion 14 includes a via connecting line formed in an upper layer of the end face at the side of the circuit forming surface of the through via 1. Each of the first chip line 12a and the second chip line 12b includes a lowermost layer line formed in the same layer as the via connecting line.

Thus, even when the first chip line 12a and the second chip line 12b are formed without stacking a plurality of lines, if the through via 1 expands, a breakage occurs between the via connecting line and the line formed in the same wiring layer as the via connecting line, so that a disconnection occurs between the first chip line 12a and the second chip line 12b. If the through via 1 contracts, the via connecting line is separated from the first chip line 12a and the second chip line 12b, with the result that a disconnection occurs between the first chip line 12a and the second chip line 12b. Accordingly, the disconnection can be checked using the buffer circuit 20 and the test circuit 30 according to the first embodiment.

Eighth Embodiment

Figure 16:
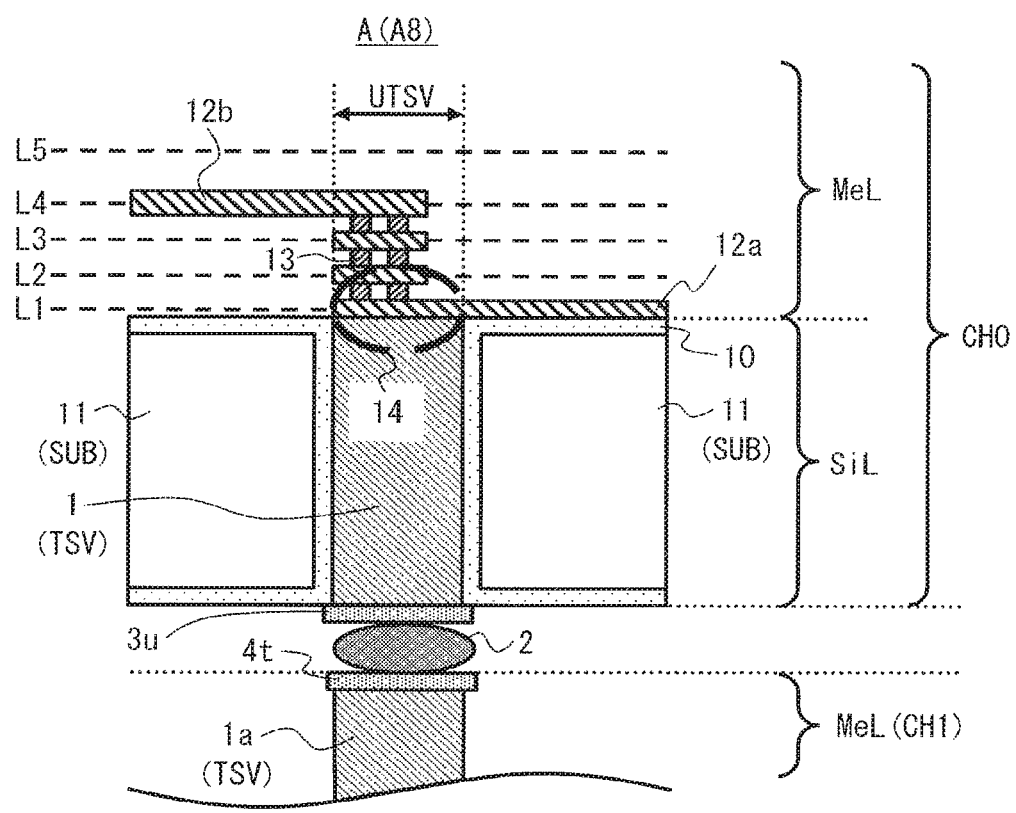
FIG. 16 is a sectional view illustrating a connecting area between a through via and a chip line of a semiconductor device according to an eighth embodiment.

In an eighth embodiment, another mode of each of the first chip line 12a and the second chip line 12b of the semiconductor device according to the third embodiment will be described. FIG. 16 shows a sectional view illustrating a connecting area (a through via connection region A8 of the eighth embodiment corresponding to the through via connection region A shown in FIG. 1) between a through via and a chip line of the semiconductor device according to the eighth embodiment.

As shown in FIG. 16, in the semiconductor device according to the eighth embodiment, the connecting wiring portion 14 includes a via connecting line formed in an upper layer of the end face at the side of the circuit forming surface of the through via 1. The first chip line 12a includes at least one upper layer line connected to the via connecting line through the via, and the second chip line 12b includes a lowermost layer line formed in the same layer as the via connecting line.

Thus, even when the first chip line 12a is formed by stacking a plurality of lines and the second chip line 12b is formed without stacking a plurality of lines, if the through via 1 expands, a breakage occurs between the via connecting line and the line formed in the same layer as the via connecting line, so that a disconnection occurs between the first chip line 12a and the second chip line 12b. If the through via 1 contracts, the via connecting line is separated from the first chip line 12a and the second chip line 12b, with the result that a disconnection occurs between the first chip line 12a and the second chip line 12b. Accordingly, the disconnection can be checked using the buffer circuit 20 and the test circuit 30 according to the first embodiment.

Ninth Embodiment

Figure 17:
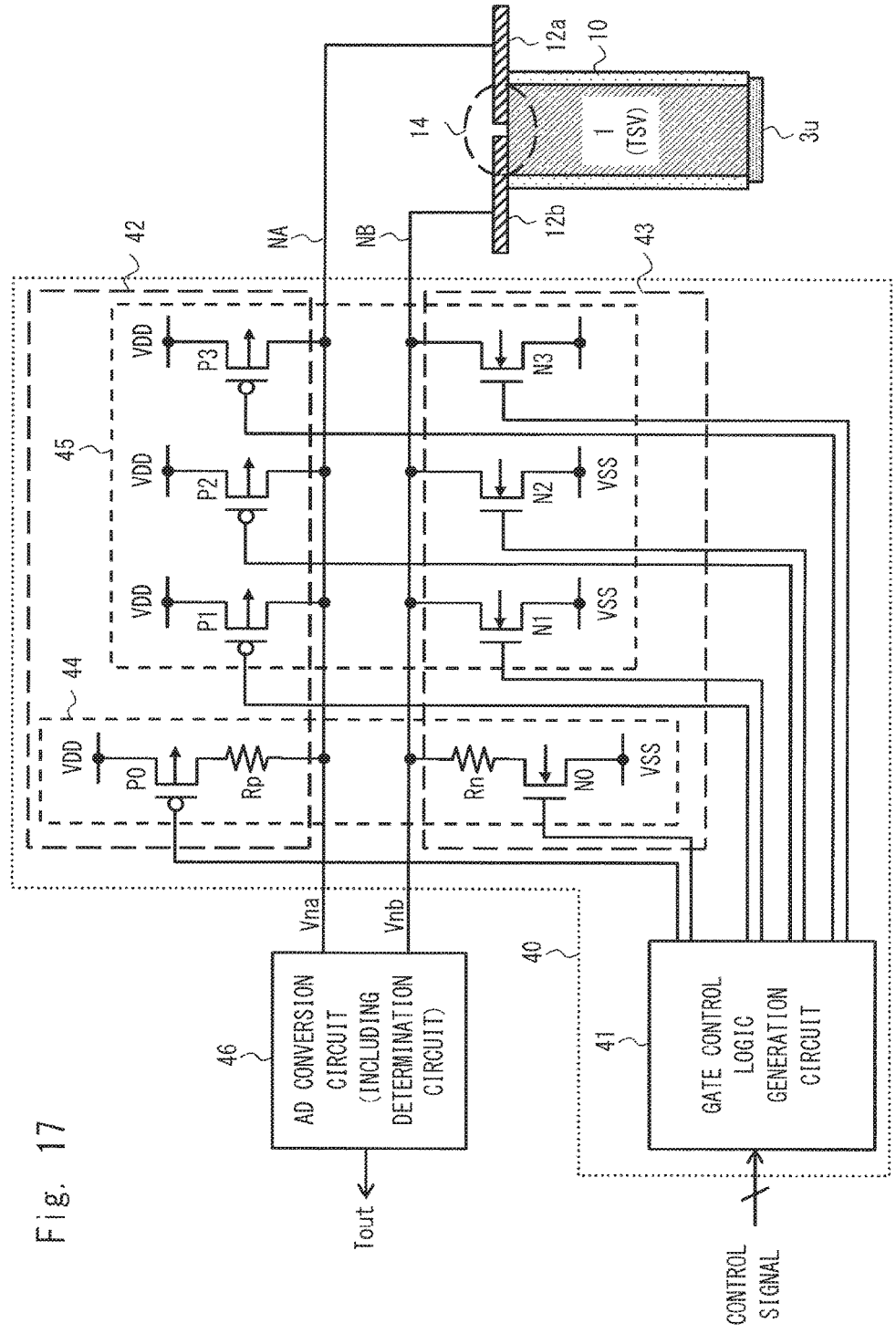
FIG. 17 is a circuit diagram showing circuits involving a test of a semiconductor device according to a ninth embodiment.

A ninth embodiment illustrates an example in which a function for conducting a driving performance test of an output buffer circuit is added to a circuit for conducting a disconnection test. FIG. 17 is a circuit diagram showing circuits involving a test of a semiconductor device according to the ninth embodiment.

As shown in FIG. 17, the semiconductor device according to the ninth embodiment includes a buffer circuit 40 and an AD conversion circuit 46. The buffer circuit 40 includes a control circuit (for example, a gate control logic generation circuit 41), a first buffer circuit 42, and a second buffer circuit 43. The first buffer circuit 42 causes a current to flow to the second buffer circuit 43 through the connecting wiring portion 14.

More specifically, the first buffer circuit 42 includes PMOS transistors P0 to P3 and a first impedance element (for example, a resistor Rp). The source of the PMOS transistor P0 is connected to a first power supply (for example, a high-voltage-side power supply VDD). The drain of the PMOS transistor P0 is connected to a first path NA through the resistor Rp. The gate of the PMOS transistor P0 is supplied with a driving signal from the gate control logic generation circuit 41. The sources of the PMOS transistors P1 to P3 are connected to the high-voltage-side power supply VDD. The drains of the PMOS transistors P1 to P3 are connected to the first path NA. The gates of the PMOS transistors P1 to P3 are supplied with the driving signal from the gate control logic generation circuit 41.

The second buffer circuit 43 includes NMOS transistors N0 to N3 and a second impedance element (for example, a resistor Rn). The source of the NMOS transistor N0 is connected to a second power supply (for example, a constant-voltage-side power supply VSS). The drain of the NMOS transistor N0 is connected to a second path NB through the resistor Rn. The gate of the NMOS transistor N0 is supplied with the driving signal from the gate control logic generation circuit 41. The sources of the NMOS transistors N1 to N3 are connected to the low-voltage-side power supply VSS. The drains of the NMOS transistors N1 to N3 are connected to the second path NB. The gates of the NMOS transistors N1 to N3 are supplied with the driving signal from the gate control logic generation circuit 41.

The PMOS transistor P0, the resistor Rp, the NMOS transistor N0, and the resistor Rn constitute a test buffer circuit 44. In this embodiment, assume that the resistor Rp and the resistor Rp have the same resistance value. The PMOS transistors P1 to P3 and the NMOS transistors N1 to N3 constitute an output buffer circuit 45.

The gate control logic generation circuit 41 generates the driving signal based on a control signal which is externally supplied or supplied from another circuit (not shown), and controls the conduction state of each of the first buffer circuit 42 and the second buffer circuit 43 according to the driving signal.

More specifically, during a disconnection test, the gate control logic generation circuit 41 controls a first PMOS transistor (for example, the PMOS transistor P0) and a first NMOS transistor (for example, the NMOS transistor N0), which constitute the test buffer circuit 44, to be brought into the conduction state. In this configuration, if no disconnection occurs, a current flows from the PMOS transistor P0 to the NMOS transistor N0, and the same voltage (for example, ½ VDD) is generated at the first path NA and the second path NB. If a disconnection occurs, no current flows from the PMOS transistor P0 to the NMOS transistor N0, and the voltage Vna of the first path NA becomes the voltage VDD of the high-voltage-side power supply VDD, and the voltage Vnb of the second path NB becomes the voltage VSS of the low-voltage-side power supply VSS. During the disconnection test, the gate control logic generation circuit 41 brings the PMOS transistors P1 to P3 and the NMOS transistors N1 to N3 into a disconnected state.

During a normal operation, the gate control logic generation circuit 41 brings one of the PMOS transistors P1 to P3 and the NMOS transistors N1 to N3, which constitute the output buffer circuit 45, into the conduction state, thereby outputting a high-level signal (for example, the voltage of the high-voltage-side power supply VDD) or a low-level signal (for example, the voltage of the low-voltage-side power supply VSS) as an output signal to the through via 1.

Further, in the driving performance test, the gate control logic generation circuit 41 controls a difference between the number of the PMOS transistors brought into the conduction state among the PMOS transistors P1 to P3 and the number of the NMOS transistors N1 to N3 controlled to be brought into the conduction state simultaneously with the PMOS transistors.

The AD conversion circuit 46 is a circuit that functions as a test circuit. The AD conversion circuit 46 monitors the voltage Vna of the first path NA and the voltage Vnb of the second path NB, determines whether the voltage Vna and the voltage Vnb satisfy the value of standard, and outputs the determination result as the test result signal Tout.

More specifically, in the disconnection test, when the voltages Vna and Vnb have the same voltage level (for example, ½ VDD), the AD conversion circuit 46 outputs the test result signal Tout indicating that no disconnection occurs. In the disconnection test, when the voltages Vna and Vnb are different (for example, when the voltage Vna is equal to VDD and the voltage Vnb is equal to VSS), the AD conversion circuit 46 outputs the test result signal Tout indicating that a disconnection occurs.

In the driving performance test, the AD conversion circuit 46 determines whether the driving performance of the output buffer circuit 45 is excellent or not based on the voltage levels of the voltages Vna and Vnb. FIG. 18 is a table showing the relationship between the number of transistors in the conduction state and an ideal voltage (for example, IOLH test) of the semiconductor device according to the ninth embodiment.

As shown in FIG. 18, in the output buffer circuit 45, when one PMOS transistor and one NMOS transistor are brought into the conduction state, the ideal value of each of the voltages Vna and Vnb is ½VDD. When one PMOS transistor is brought into the conduction state and two NMOS transistor are brought into the conduction state, the ideal value of each of the voltages Vna and Vnb is ⅓VDD. When one PMOS transistor is brought into the conduction state and three NMOS transistors are brought into the conduction state, the ideal value of each of the voltages Vna and Vnb is ¼VDD. When two PMOS transistors are brought into the conduction state and one NMOS transistor is brought into the conduction state, the ideal value of each of the voltages Vna and Vnb is ⅔VDD. When three PMOS transistors are brought into the conduction state and one NMOS transistor is brought into the conduction state, the ideal value of each of the voltages Vna and Vnb is ¾VDD.

When the voltages Vna and Vnb fall out of the ideal value shown in FIG. 18 by an allowable range value or more, the AD conversion circuit 46 outputs the test result signal Tout indicating that a driving performance failure occurs. When the voltages Vna and Vnb fall within the allowable range value that is determined as the ideal value shown in FIG. 18, the AD conversion circuit 46 outputs the test result signal Tout indicating that the output buffer circuit 45 has a driving performance that satisfies the standard.

As described above, in the semiconductor device according to the ninth embodiment, the disconnection test as well as the driving performance test of the output buffer circuit 45 can be carried out using only the own chip. As described above, in each through via 1, a pad exposed to the outside is extremely small, which makes it difficult to actually conduct a probe test. However, the provision of the AD conversion circuit 46 as shown in FIG. 17 enables checking of the driving performance of the output buffer circuit 45 without conducting any probe test.

Tenth Embodiment

Figure 19:
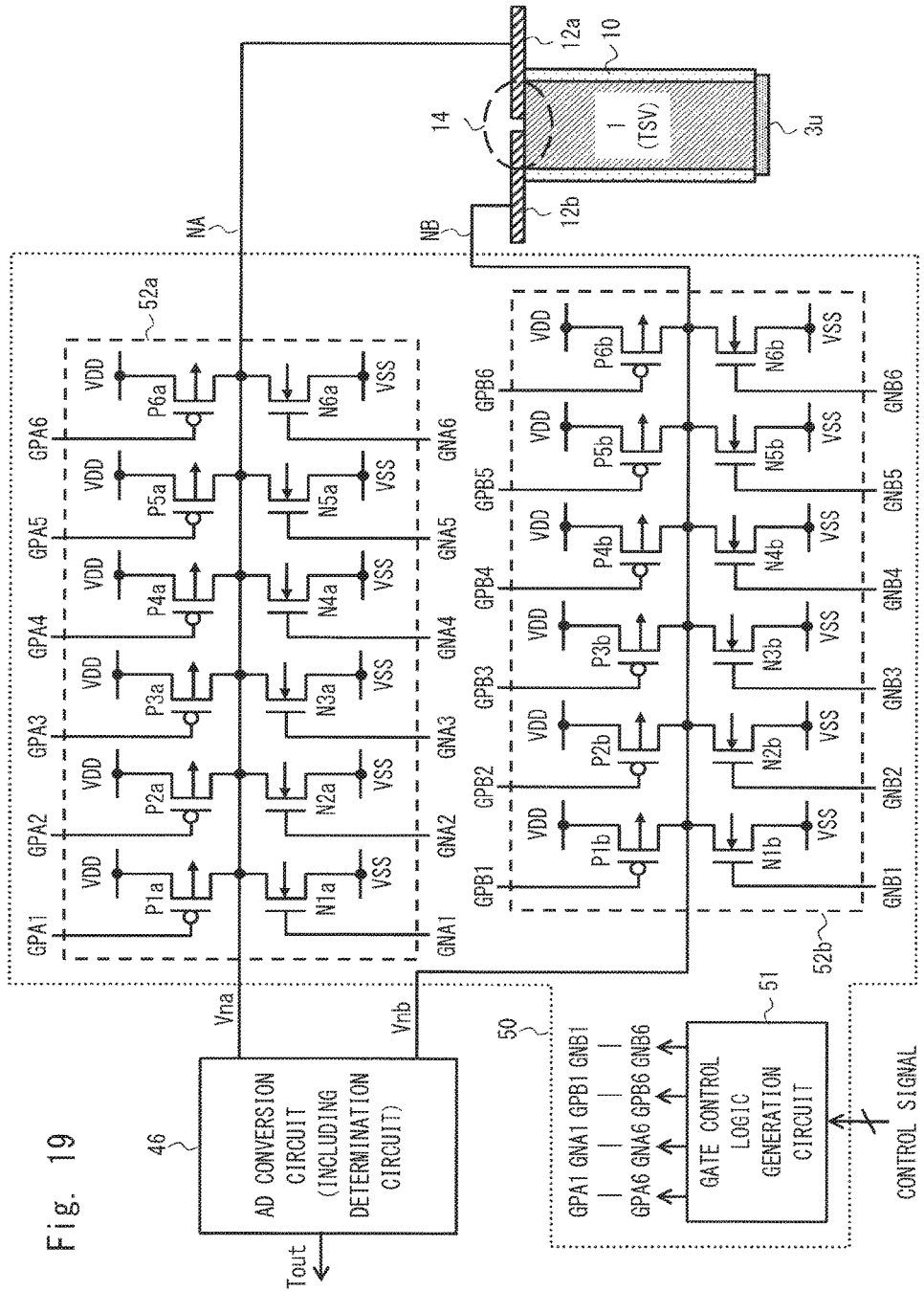
FIG. 19 is a circuit diagram of showing circuits involving a test of a semiconductor device according to a tenth embodiment.

A tenth embodiment illustrates an example in which a disconnection test is conducted using an output buffer circuit. FIG. 19 is a circuit diagram showing circuits involving a test of a semiconductor device according to the tenth embodiment. As shown in FIG. 19, the semiconductor device according to the tenth embodiment includes a buffer circuit 50 and an AD conversion circuit 46.

The buffer circuit 50 includes a control circuit (for example, a gate control logic generation circuit 51), a first buffer circuit 52a, and a second buffer circuit 52b. The gate control logic generation circuit 51 supplies a control signal to transistors constituting the first buffer circuit 52a and the second buffer circuit 52b.

The first buffer circuit 52a and the second buffer circuit 52b are obtained by dividing an output buffer that outputs a signal to the through via 1. The first buffer circuit 52a outputs an output signal to the first path NA, and the second buffer circuit 52b outputs an output signal to the second path NB.

The first buffer circuit 52a includes PMOS transistors P1a to P6a and NMOS transistors N1a to N6a. The sources of the PMOS transistors P1a to P6a are connected to the high-voltage-side power supply VDD. The drains of the PMOS transistors P1a to P6a are connected to the first path NA. The gates of the PMOS transistors P1a to P6a are supplied with control signals GPA1 to GPA6, respectively, which are output from the gate control logic generation circuit 51. The sources of the NMOS transistors N1a to N6a are connected to the low-voltage-side power supply VSS. The drains of the NMOS transistors N1a to N6a are connected to the first path NA. The gates of the NMOS transistors N1a to N6a are supplied with control signals GNA1 to GNA6, respectively, from the gate control logic generation circuit 51.

The second buffer circuit 52b includes PMOS transistors P1b to P6b and NMOS transistors N1b to N6b. The sources of the PMOS transistors P1b to P6b are connected to the high-voltage-side power supply VDD. The drains of the PMOS transistors P1b to P6b are connected to the second path NB. The gates of the PMOS transistors P1b to P6b are supplied with control signals GPB1 to GPB6, respectively, which are output from the gate control logic generation circuit 51. The sources of the NMOS transistors N1b to N6b are connected to the low-voltage-side power supply VSS. The drains of the NMOS transistors N1b to N6b are connected to the second path NB. The gates of the NMOS transistors N1b to N6b are supplied with control signals GNB1 to GNB6, respectively, from the gate control logic generation circuit 51.

Subsequently, test methods for a disconnection test and a driving performance test in the semiconductor device according to the tenth embodiment will be described. FIG. 20 is a table showing the relationship between the number of transistors in a conduction state and an ideal voltage in each of a driving performance test (for example, IOLH test) and a disconnection test of the semiconductor device according to the tenth embodiment.

First, in the driving performance test, when the PMOS transistors of the first buffer circuit 52a are brought into the conduction state, the semiconductor device according to the tenth embodiment brings the NMOS transistors of the first buffer circuit 52a and the PMOS transistors of the second buffer circuit 52b into a disconnected state, and brings the NMOS transistors of the second buffer circuit 52b into the conduction state. In the driving performance test, when the NMOS transistors of the first buffer circuit 52a are brought into the conduction state, the semiconductor device according to the tenth embodiment brings the PMOS transistors of the first buffer circuit 52a and the NMOS transistors of the second buffer circuit 52b into the disconnected state, and brings the PMOS transistors of the second buffer circuit 52b into the conduction state.

As shown in FIG. 20, in the semiconductor device according to the tenth embodiment, in the driving performance test, when one PMOS transistor and one NMOS transistor are brought into the conduction state, the ideal value of each of the voltages Vna and Vnb is ½VDD. When one PMOS transistor is brought into the conduction state and two NMOS transistors are brought into the conduction state, the ideal value of each of the voltages Vna and Vnb is ⅓VDD. When one PMOS transistor is brought into the conduction state and three NMOS transistors are brought into the conduction state, the ideal value of each of the voltages Vna and Vnb is ¼VDD. When two PMOS transistors are brought into the conduction state and one NMOS transistor is brought into the conduction state, the ideal value of each of the voltages Vna and Vnb is ⅔VDD. When three PMOS transistors are brought into the conduction state and one NMOS transistor is brought into the conduction state, the ideal value of each of the voltages Vna and Vnb is ¾VDD.

Note that in the driving performance test, if a disconnection occurs between the first path NA and the second path NB, a voltage at a node connected to the PMOS transistor in the conduction state becomes VDD, and a voltage at a node connected to the NMOS transistor in the conduction state becomes VSS.

In the semiconductor device according to the tenth embodiment, when the PMOS transistors of one of the buffer circuits are brought into the conduction state in the disconnection test, the NMOS transistors of the buffer circuit and the PMOS transistors and NMOS transistors of the other buffer circuit are brought into the disconnected state. Further, when the NMOS transistors of one of the buffer circuits are brought into the conduction state in the disconnection test, the semiconductor device according to the tenth embodiment brings the PMOS transistors of the buffer circuit and the PMOS transistors and NMOS transistors of the other buffer circuit into the disconnected state.

As shown in FIG. 20, in the semiconductor device according to the tenth embodiment, one PMOS transistor is brought into the conduction state and one NMOS transistor is brought into the disconnected state in the disconnection test. As a result, the ideal value of each of the voltages Vna and Vnb becomes VDD if no disconnection occurs. At this time, if a disconnection occurs, the voltage of the path connected to the PMOS transistor in the conduction state becomes VDD, and other path becomes high impedance. In the semiconductor device according to the tenth embodiment, one NMOS transistor can be brought into the conduction state and one PMOS transistor can be brought into the disconnected state in the disconnection test. In this case, the ideal value of each of the voltages Vna and Vnb becomes VSS if no disconnection occurs. At this time, if a disconnection occurs, the voltage of the path connected to the NMOS transistor in the conduction state becomes VSS and other path becomes high impedance.

With reference to the table shown in FIG. 20, the AD conversion circuit 46 determines whether the driving performance of each of the first buffer circuit 52a and the second buffer circuit 52b is excellent or not and determines the presence or absence of a disconnection in each of the first path NA and the second path NB, and then outputs the test result signal Tout based on the determination result.

As described above, in the semiconductor device according to the tenth embodiment, the driving performance test as well as the disconnection test can be carried out by using only the buffer circuits 52a and 52b which are used in the normal operation, without using any test buffer circuit. Thus, the semiconductor device according to the tenth embodiment can reduce the circuit size by omitting the test buffer circuit.

Eleventh Embodiment

Figures 21, 22:
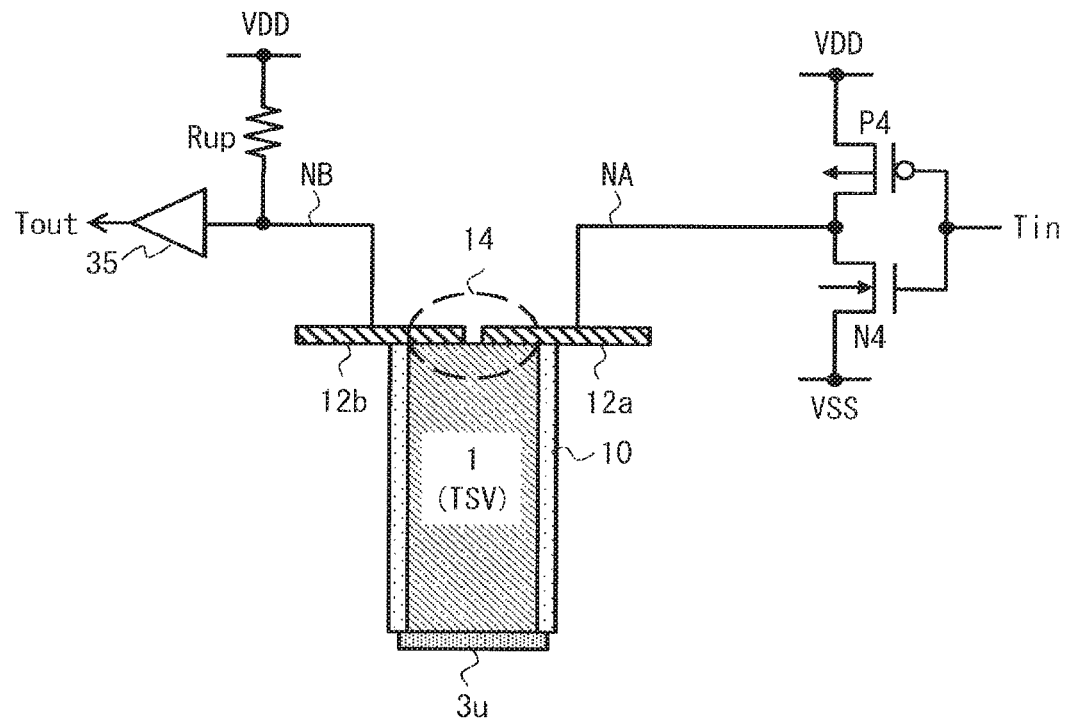
FIG. 21 is a circuit diagram showing circuits involving a test of a semiconductor device according to an eleventh embodiment.
FIG. 22 is a table illustrating operation of a circuit when a disconnection test of the semiconductor device according to the eleventh embodiment is conducted.

In an eleventh embodiment, another mode of each circuit for use in a disconnection test will be described. FIG. 21 is a circuit diagram showing circuits involving a test of a semiconductor device according to the eleventh embodiment. As shown in FIG. 21, the semiconductor device according to the eleventh embodiment includes an output buffer circuit serving as the first buffer circuit connected to the first path NA, and an input buffer circuit serving as the second buffer circuit connected to the second path NB.

The output buffer circuit outputs a current to the first path NA. The output buffer circuit is an inverter circuit composed of a PMOS transistor P4 and an NMOS transistor N4. This inverter circuit receives a test input signal Tin. The inverter circuit supplies an output signal indicating an inverted logic of the test input signal Tin to each of the first path NA and the second path NB.

The input buffer circuit outputs a test result signal based on the voltage of the second path NB. The input buffer circuit includes a pull-up resistor Rup and a comparator 35. The pull-up resistor Rup is connected between an input terminal of the comparator 35 and the high-voltage-side power supply VDD.

Subsequently, a test method for a disconnection test in the semiconductor device according to the eleventh embodiment will be described. FIG. 22 is a table illustrating operation of a circuit that carried out the disconnection test of the semiconductor device according to the eleventh embodiment.

As shown in FIG. 22, in the semiconductor device according to the eleventh embodiment, a high-level signal is input as the test input signal Tin in the case of conducting a disconnection test. At this time, if no disconnection occurs, the inverter circuit outputs a low-level signal, and the voltage of the second path NB becomes the voltage of the low-voltage-side power supply VSS. The comparator 35 determines that the voltage of the second path NB is lower than a threshold voltage and outputs a low-level test result signal. On the other hand, if a disconnection occurs, the output signal of the inverter circuit is not transmitted to the second path NB, and the voltage of the second path NB is brought to the high level by the pull-up resistor Rup. Accordingly, if a disconnection occurs, the comparator 35 outputs a high-level test result signal.

As described above, in the semiconductor device including the through via and the connecting wiring portion 14, any circuit having a configuration in which a current flows between the first path NA and the second path NB through the connecting wiring portion 14 can conduct a disconnection test. Specifically, various modes can be considered as the circuit for checking a disconnection in the semiconductor device having the through via. The circuit described in the eleventh embodiment is considered as an example of the inverter circuit that extracts a current from the first path NA side through the connecting wiring portion 14 to conduct a disconnection test.

The first to eleventh embodiments can be combined as desirable by one of ordinary skill in the art.

While the invention has been described in terms of several embodiments, those skilled in the art will recognize that the invention can be practiced with various modifications within the spirit and scope of the appended claims and the invention is not limited to the examples described above.

Further, the scope of the claims is not limited by the embodiments described above.

Furthermore, it is noted that, Applicant's intent is to encompass equivalents of all claim elements, even if amended later during prosecution.

What is claimed is:

1. A semiconductor device comprising:
a through via formed to penetrate a semiconductor substrate;
a first buffer circuit and a second buffer circuit;
a wiring forming layer formed in an upper layer of the semiconductor substrate;
a connecting wiring portion formed in an upper portion of the through via, wherein a direction from the semiconductor substrate to the wiring forming layer is an upward direction, the connecting wiring portion being formed on a chip inner end face that faces the upper portion of the semiconductor substrate at an end face of the through via;
a first path connecting the first buffer circuit and the through via;
a second path connecting the second buffer circuit and the through via; and
a test circuit that outputs a test result signal indicating an occurrence of a disconnection in the connecting wiring portion, based on a fact that a voltage of the first path and a voltage of the second path have different voltage values,
wherein the first path and the second path are electrically connected via the connecting wiring portion and one of the first and second buffer circuits causes a current to flow to the other of the first and second buffer circuits through the connecting wiring portion,
wherein the first buffer circuit includes a first PMOS transistor and a first impedance element, the first PMOS transistor and the first impedance element being connected in series between a first power supply and the first path,
wherein the second buffer circuit includes a first NMOS transistor and a second impedance element, the first NMOS transistor and the second impedance element being connected in series between a second power supply and the second path, and
wherein the semiconductor device further comprises a control circuit that controls the first PMOS transistor and the first NMOS transistor to be simultaneously brought into a conduction state in a process of checking a disconnection of the connecting wiring portion.

2. The semiconductor device according to claim 1, wherein the connecting wiring portion is a wiring region formed with an area equal to or smaller than an area of the chip inner end face of the through via.

3. The semiconductor device according to claim 1, wherein
the connecting wiring portion corresponds to the chip inner end face,
one end of the first path is connected to the chip inner end face of the through via, and
one end of the second path is connected to the chip inner end face of the through via.

4. The semiconductor device according to claim 3, wherein each of the first and second paths includes:
a via connecting line connected to the through via; and
at least one upper layer line connected to the via connecting line through a via in a region other than the upper portion of the chip inner end face.

5. The semiconductor device according to claim 3, wherein each of the first and second paths includes:
a via connecting line connected to the through via; and
at least one upper layer line connected to the via connecting line through a via in the upper portion of the chip inner end face.

6. The semiconductor device according to claim 1, wherein
the connecting wiring portion includes a via connecting line formed in contact with the chip inner end face in the upper portion of the chip inner end face of the through via, and
each of the first and second paths includes at least one upper layer line connected to the via connecting line through a via in a region other than the upper portion of the chip inner end face.

7. The semiconductor device according to claim 1, wherein
the connecting wiring portion includes a via connecting line formed in contact with the chip inner end face in an upper portion of the chip inner end face of the through via, and
each of the first and second paths includes at least one upper layer line connected to the via connecting line through a via in the upper portion of the chip inner end face.

8. The semiconductor device according to claim 1, wherein
the connecting wiring portion includes a via connecting line formed in contact with the chip inner end face in the upper portion of the chip inner end face of the through via, and at least one first upper layer line connected to the via connecting line through a via, and
each of the first and second paths includes a second upper layer line connected to the first upper layer line through the via.

9. The semiconductor device according to claim 1, wherein
the connecting wiring portion includes a via connecting line formed in contact with the chip inner end face in the upper portion of the chip inner end face of the through via, and
each of the first and second paths includes at least one upper layer line connected to the via connecting line through a via in a region other than the upper portion of the chip inner end face.

10. The semiconductor device according to claim 1, wherein
the connecting wiring portion includes a via connecting line formed in contact with the chip inner end face in the upper portion of the chip inner end face of the through via, and
each of the first and second paths includes a lowermost layer line formed in the same layer as the via connecting line.

11. The semiconductor device according to claim 1, wherein
the connecting wiring portion includes a via connecting line formed in contact with the chip inner end face in the upper portion of the chip inner end face of the through via,
the first path includes at least one upper layer line connected to the via connecting line through a via, and the second path includes a lowermost layer line formed in the same layer as the via connecting line.

12. The semiconductor device according to claim 1, wherein
the first buffer circuit includes an output buffer circuit that outputs a current to the first path, and
the second buffer circuit includes an input buffer circuit that outputs the test result signal based on a voltage of the second path.

13. The semiconductor device according to claim 1, wherein the first buffer circuit and the second buffer circuit are simultaneously in a conduction state when the first buffer outputs the test signal.

14. A semiconductor device comprising:
a through via formed to penetrate a semiconductor substrate;
a first buffer circuit and a second buffer circuit;
a wiring forming layer formed in an upper layer of the semiconductor substrate;
a connecting wiring portion formed in an upper portion of the through via, wherein a direction from the semiconductor substrate to the wiring forming layer is an upward direction, the connecting wiring portion being formed on a chip inner end face that faces the upper portion of the semiconductor substrate at an end face of the through via;
a first path connecting the first buffer circuit and the through via;
a second path connecting the second buffer circuit and the through via;
a test circuit that outputs a test result signal indicating an occurrence of a disconnection in the connecting wiring portion, based on a fact that a voltage of the first path and a voltage of the second path have different voltage values,
wherein the first path and the second path are electrically connected via the connecting wiring portion and one of the first and second buffer circuits causes a current to flow to the other of the first and second buffer circuits through the connecting wiring portion,
wherein the first buffer circuit includes a plurality of PMOS transistors connected between a first power supply and the first path,
wherein the second buffer circuit includes a plurality of NMOS transistors and a second impedance element connected between a second power supply and the second path, and
wherein the semiconductor device further comprises a control circuit that controls a difference between the number of the PMOS transistors to be brought into a conduction state and the number of the NMOS transistors to be brought into a conduction state simultaneously with the plurality of PMOS transistors, in a process of checking a disconnection of the connecting wiring portion.

* * * * *